United States Patent [19]
Hsieh et al.

[11] Patent Number: 5,625,780
[45] Date of Patent: Apr. 29, 1997

[54] PROGRAMMABLE BACKPLANE FOR BUFFERING AND ROUTING BI-DIRECTIONAL SIGNALS BETWEEN TERMINALS OF PRINTED CIRCUIT BOARDS

[75] Inventors: Wen-Jai Hsieh; Chi-Song Horng; Chun C. D. Wong, all of Palo Alto, Calif.

[73] Assignee: I-Cube, Inc., Campbell, Calif.

[21] Appl. No.: 333,484

[22] Filed: Nov. 2, 1994

Related U.S. Application Data

[63] Continuation-in-part of Ser. No. 171,752, Dec. 21, 1993, Pat. No. 5,426,738, which is a continuation of Ser. No. 785,082, Oct. 30, 1991, abandoned.

[51] Int. Cl.$^6$ .................. G06F 13/00; G06F 13/36
[52] U.S. Cl. .................. 395/311; 395/306; 395/200.15; 370/388
[58] Field of Search .................. 395/250, 821, 395/200.15, 311; 364/900; 370/94.3

[56] References Cited

U.S. PATENT DOCUMENTS

| | | | |
|---|---|---|---|
| 4,453,229 | 6/1984 | Schaire | 364/900 |
| 5,088,091 | 2/1992 | Schroeder et al. | 370/94.3 |
| 5,280,474 | 1/1994 | Nicholls et al. | 370/60 |
| 5,282,271 | 1/1994 | Hsieh et al. | 395/275 |
| 5,426,738 | 6/1995 | Hsieh et al. | 395/275 |
| 5,428,750 | 6/1995 | Hsieh et al. | 395/275 |
| 5,428,800 | 6/1995 | Hsieh et al. | 395/775 |
| 5,465,056 | 11/1995 | Hsieh et al. | 326/41 |
| 5,469,473 | 11/1995 | McClear et al. | 375/219 |

*Primary Examiner*—Ayaz R. Sheikh
*Assistant Examiner*—Jigar Pancholi
*Attorney, Agent, or Firm*—Smith-Hill and Bedell

[57] ABSTRACT

A programmable backplane includes a motherboard having slots for receiving printed circuit boards (PCBs). A field programmable interconnect device (FPID) mounted on the motherboard includes a programmable crosspoint switch for selectively routing signals between terminals of the PCBs. The routing is determined by input programming data. The FPID bi-directionally buffers all signals passing between ports of the crosspoint switch and the PCB terminals and can alter signal routing dynamically in response to routing instructions generated by instruction sources mounted on or connected to the PCBs. The programmable backplane may be used as a communication hub in a communication network or parallel processing system.

32 Claims, 26 Drawing Sheets

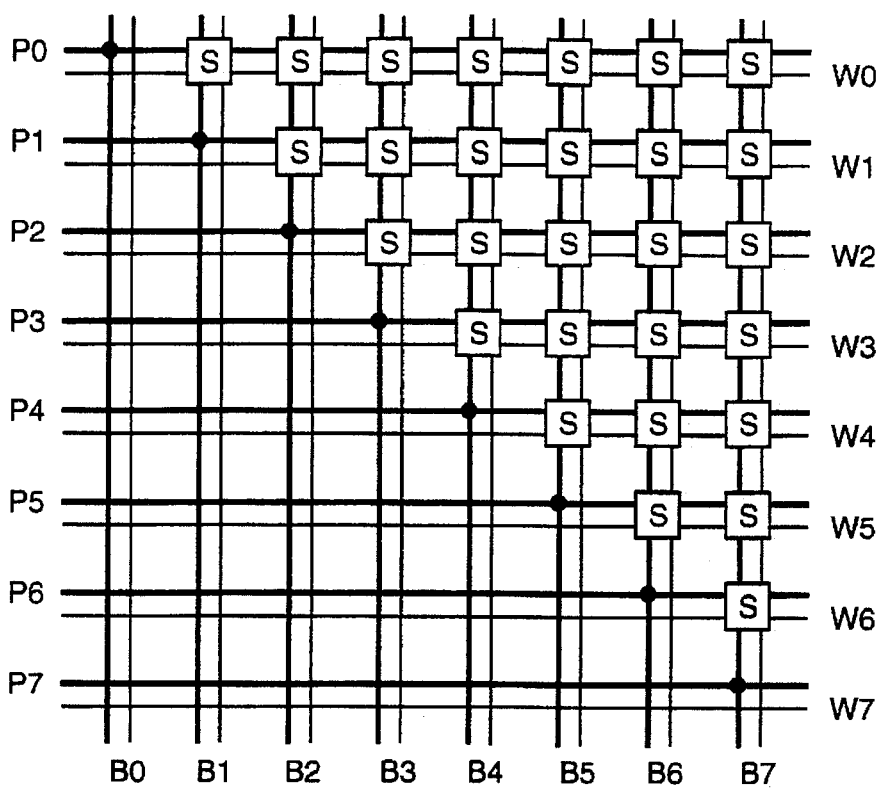
FIG. 12A
(PRIOR ART)
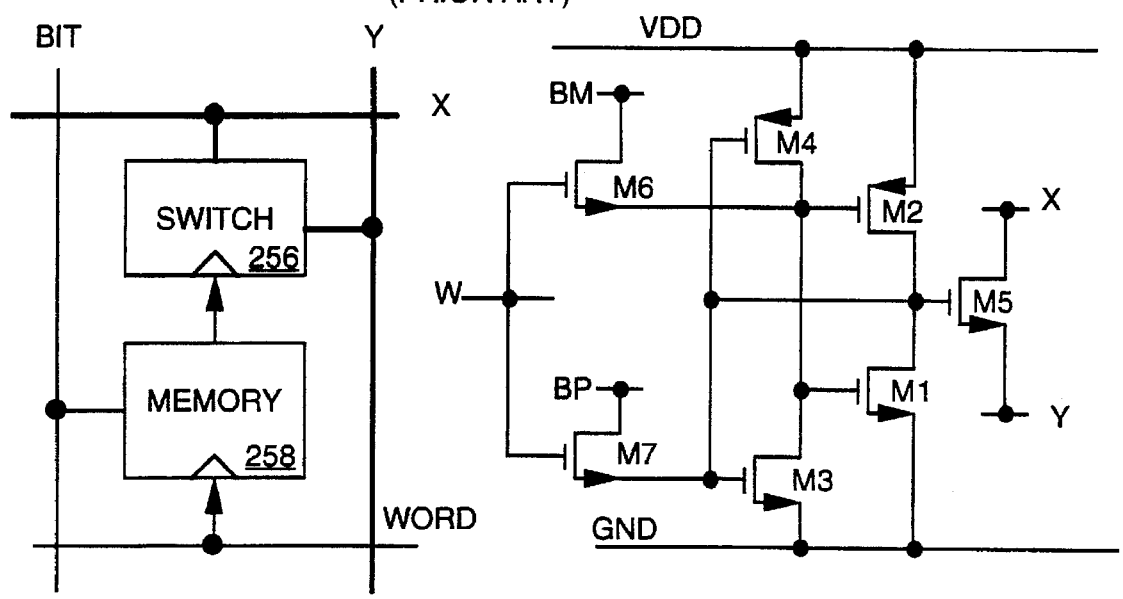
FIG. 12B
(PRIOR ART)
FIG. 12C
(PRIOR ART)

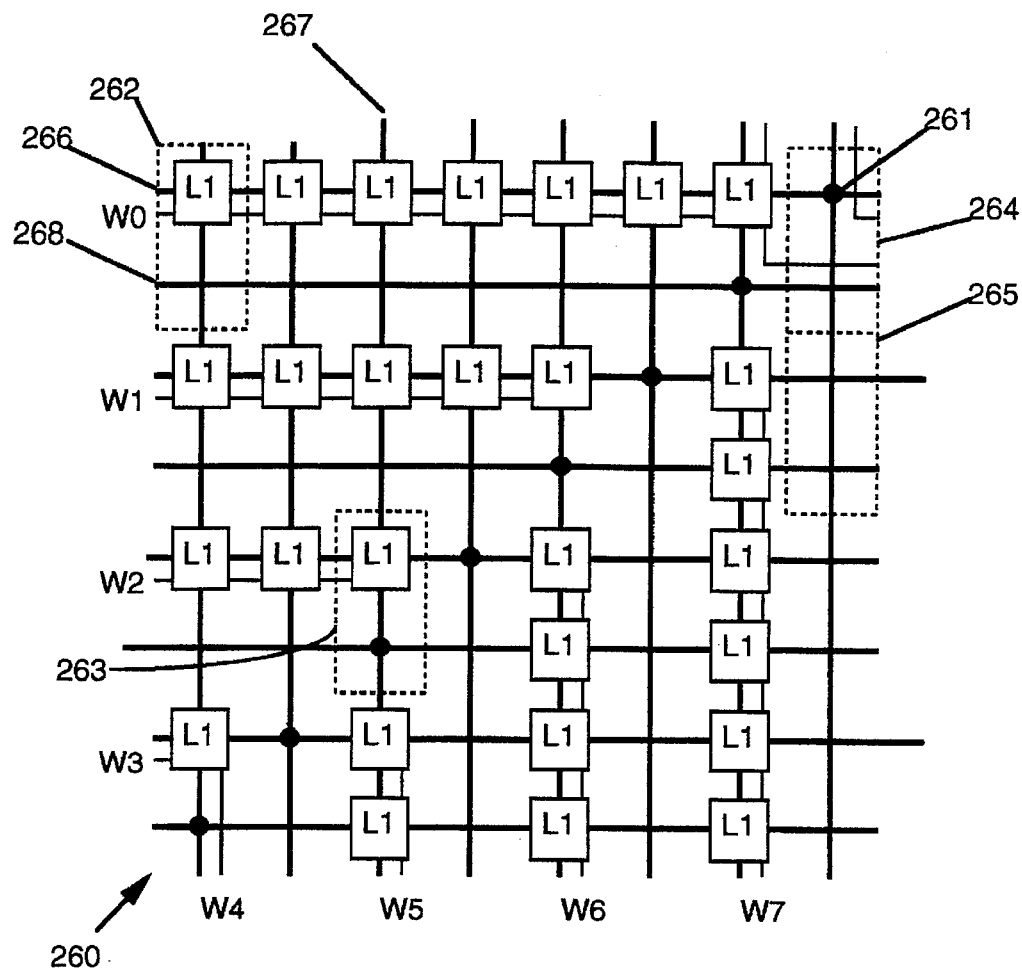
FIG. 13B
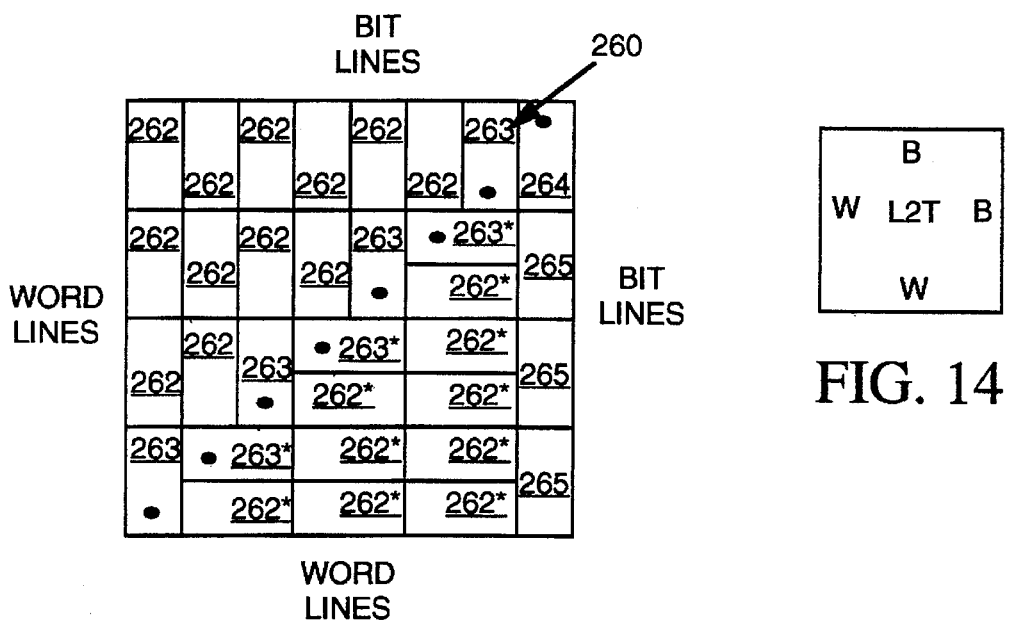
FIG. 13C
FIG. 14

PROGRAMMABLE BACKPLANE FOR BUFFERING AND ROUTING BI-DIRECTIONAL SIGNALS BETWEEN TERMINALS OF PRINTED CIRCUIT BOARDS

CROSS-REFERENCE TO RELATED APPLICATIONS

This present application is a continuation-in-part of application Ser. No. 08/171,752, filed Dec. 21, 1993 (now U.S. Pat. No. 5,426,738, issued Jun. 20, 1995) which is in turn a continuation of U.S. patent application Ser. No. 07/785,082, filed Oct. 30, 1991, now abandoned.

BACKGROUND OF THE INVENTION

1. Field of the Invention

The present invention relates in general to a backplane for interconnecting printed circuit boards and in particular to a backplane providing programmably adjustable routing and active buffering of signals passing between the boards.

2. Description of Related Art

Electronic systems such as personal computers typically include several printed circuit boards (PCBs) which communicate with one another through a backplane. The backplane, usually implemented on a mother board containing slots for receiving the PCBs, includes conductive traces on the motherboard forming shared bus and/or point-to-point connections between the slots. Most backplane designs are passive in that they do not actively buffer (amplify) signals passing between the PCBs.

Designing a passive shared bus backplane that can support data transfer rates of 40 MHz or higher is difficult. FIG. 1A illustrates various devices that may be connected to a line 1 of a shared bus. FIG. 1B is an equivalent impedance diagram of FIG. 1A. As illustrated in FIGS. 1A and 1B, a line 1 of a shared bus may be connected to a large number of drivers 2, receivers 3 or transceivers 4, each contributing a capacitive load of approximately 5 pf, 10–12 pf and 15–20 pf, respectively. In addition the printed trace on the motherboard that form line 1 contributes another 1.5 pf/inch. The potentially large loading of a bus line, often adding up to 250–300 pf, can result in a delay of 12–15 ns and can limit the performance of a shared bus backplane. Therefore for a given performance, passive backplanes can serve only a limited number of components and the loading provided by each component must be carefully controlled.

The shared bus backplane has an advantage in that the particular slot in which a PCB is installed is irrelevant; each slot provides the same access to the backplane. However in applications where high speed communication between particular PCBs is needed, backplanes provide point-to-point connections between the PCBs. In such applications a backplane provides a connection from a driver on one PCB to receivers on one or more other PCBs but not to receivers on every PCB. The interconnections between slots is fixed by the arrangement of conductors on the motherboard interconnecting the slots. Therefore the slot in which a PCB is inserted determines how the PCB communicates with the rest of the system. Any change in the routing of signals between PCBs requires a change in the motherboard conductor arrangement.

What is needed is a backplane architecture for routing signals between PCBs, wherein common nodes have low and uniform impedance regardless of the number of components connected thereto, and wherein routing of interconnections between PCBs its easily modified.

SUMMARY OF THE INVENTION

In accordance with one aspect of the invention, a programmable backplane system includes a motherboard having slots for receiving printed circuit boards (PCBs). A field programmable interconnect device (FPID) mounted on the motherboard includes a programmable crosspoint switch for routing signals between PCBs in accordance with input programming data. The FPID also buffers all signals passing in either direction between ports of the crosspoint switch and the PCB.

Since the FPID actively buffers the signal paths it provides between the PCBs, the capacitive load that must be driven from each PCB output node is constant, about 12 pf, and the capacitive load provided by each PCB input node can be made uniform for optimum system performance. The FPID may fan out signals internally but adds only about 0.5 ns of signal delay for each additional connection. Thus the data transfer rate of a bus implemented by the FPID is much greater than for a typical passive bus implemented by traces on the motherboard. Since the interconnections provided by the FPID may be easily changed by reprogramming the FPID, point-to-point interconnections between PCBs may be altered without altering the motherboard hardware.

In accordance with another aspect of the invention, the bi-directional buffers automatically sense direction of signal flow and buffer signal in the sensed direction so that transmitting PCBs do not need to provide directional control signals to the buffers.

It is accordingly an object of the invention to provide a backplane architecture implementing both shared and point-to-point communications between PCBs, wherein common nodes have low and uniform impedance, and wherein interconnections between PCBs are easily modified.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 12A illustrates in block diagram form a prior art 8-port triangular crosspoint switch array;

FIG. 12B illustrates in block diagram form a typical prior art switch cell of FIG. 12A;

FIG. 12C illustrates in schematic diagram form a typical prior art switch cell S of FIG. 12A;

Figure 4A:
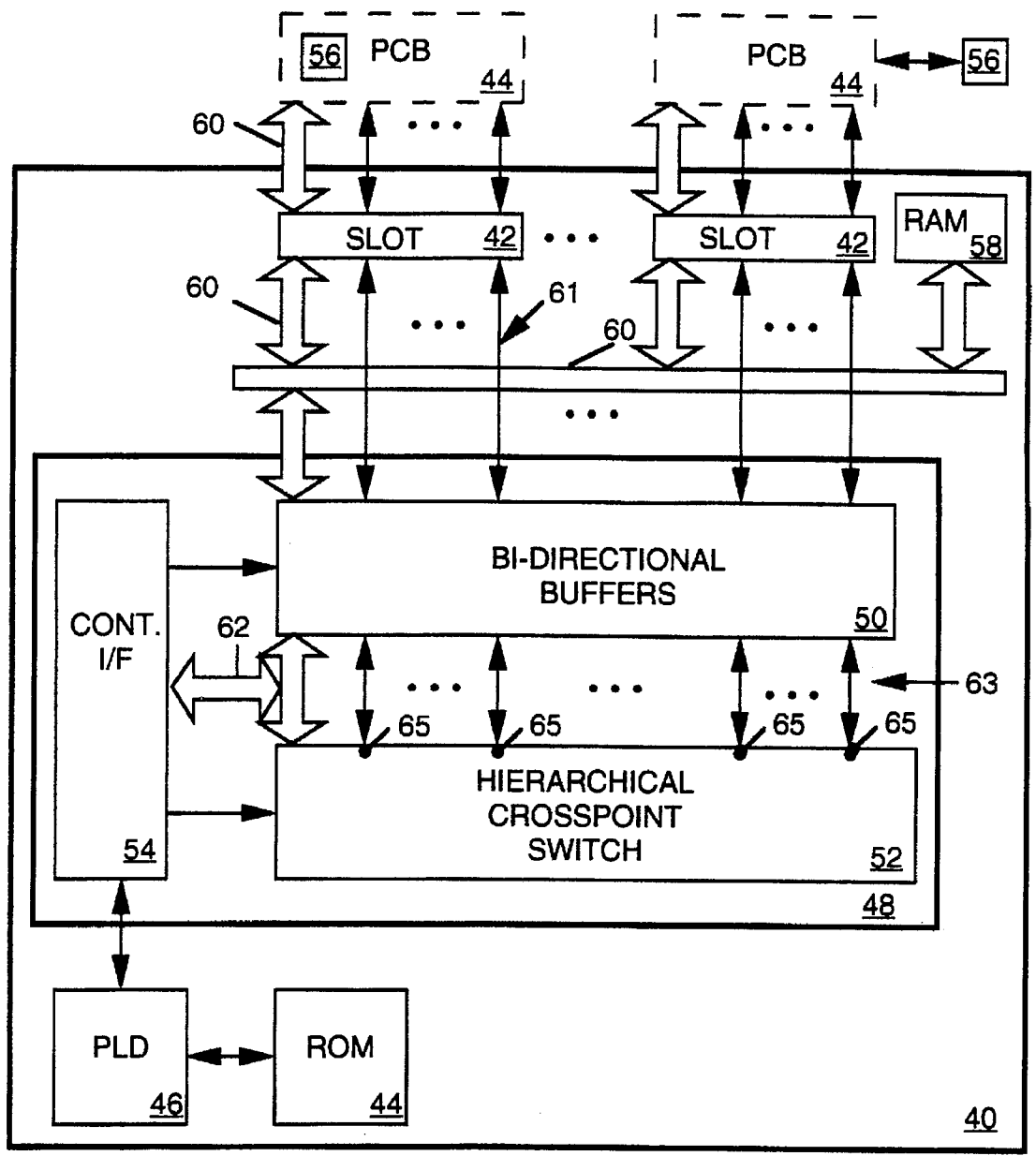
FIG. 4A illustrates in block diagram form an alternative embodiment of the invention which permits dynamic reconfiguration of a backplane.
Figure 10:
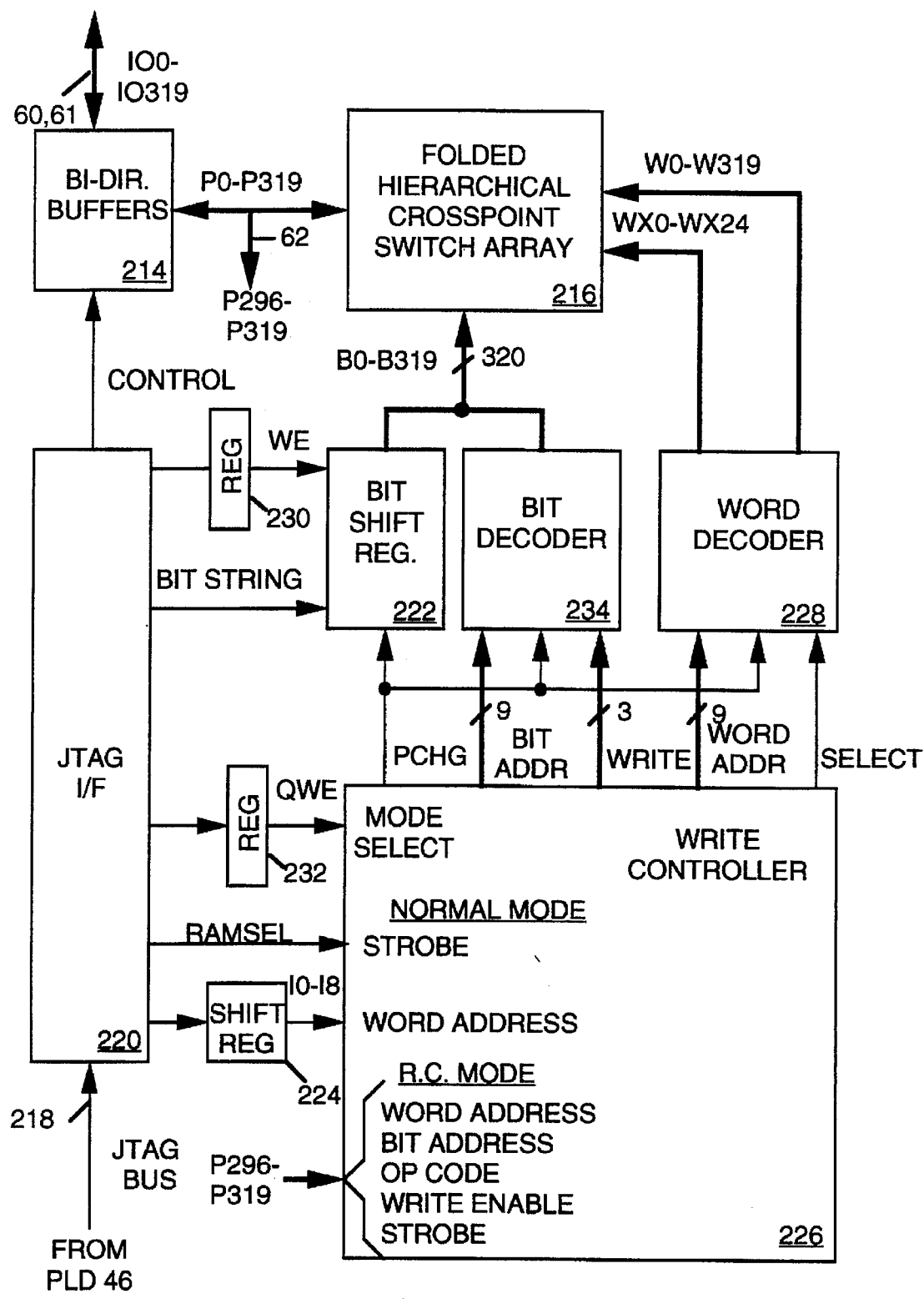
FIG. 10 illustrates in block diagram form the hierarchical field programmable interconnect device (FPID) of FIG. 4A.
Figure 13A:
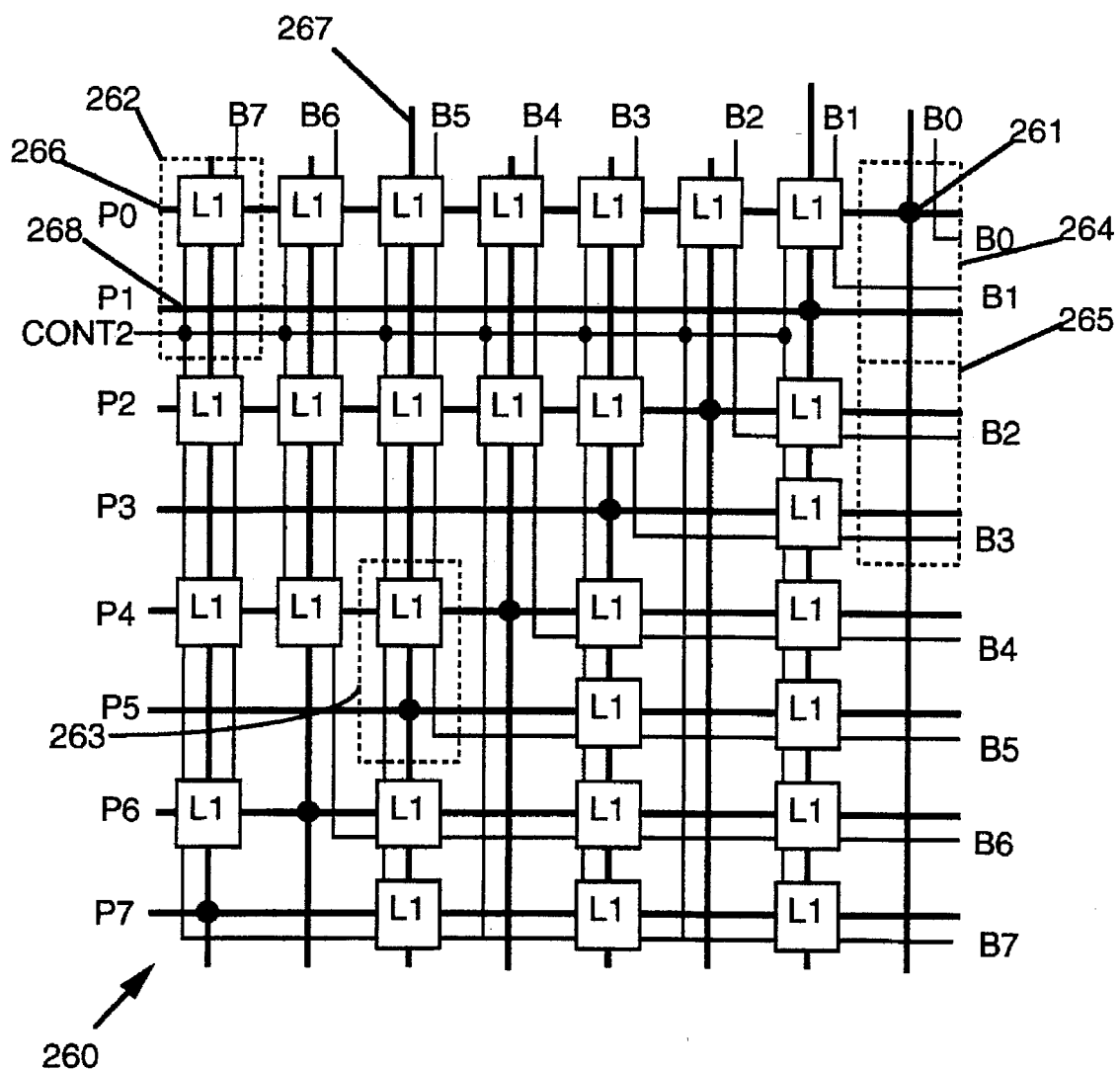
Figure 15:
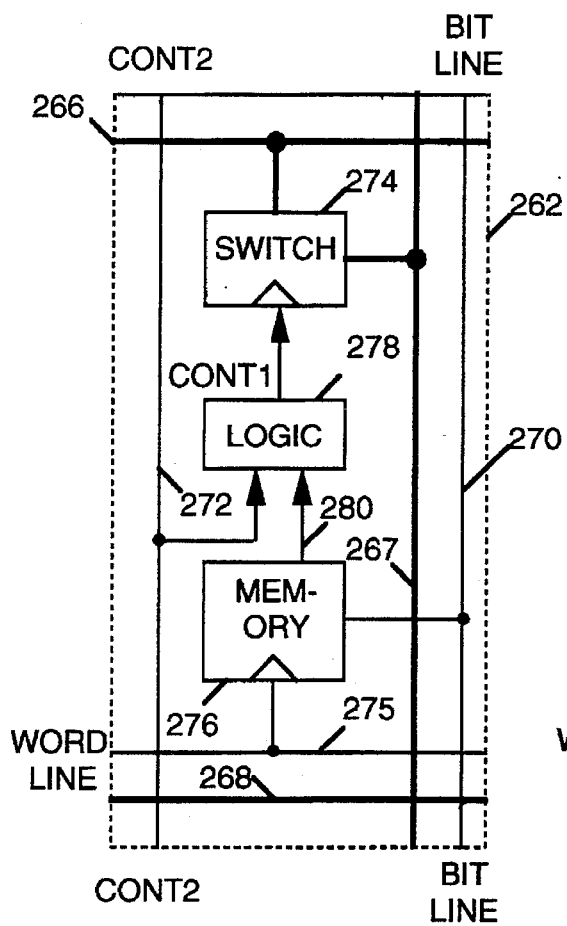
Figure 16:
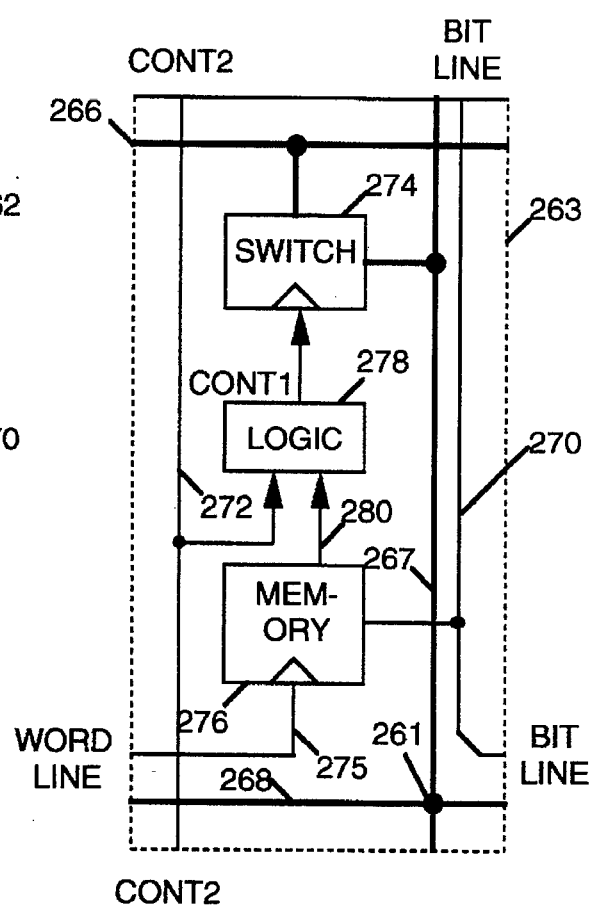
Figure 17:
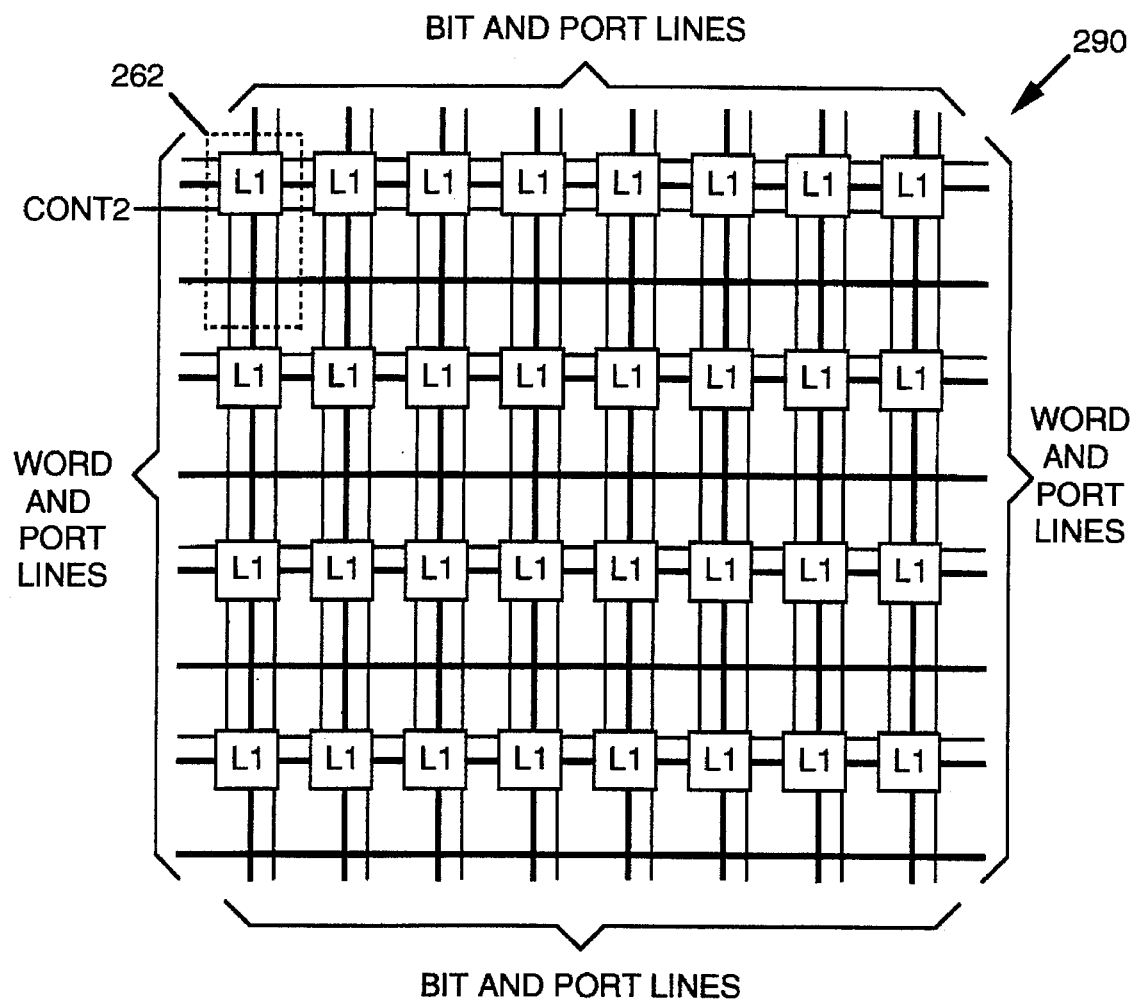
Figure 18:
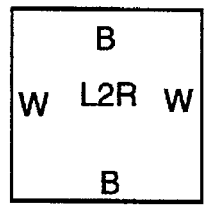
Figure 19A:
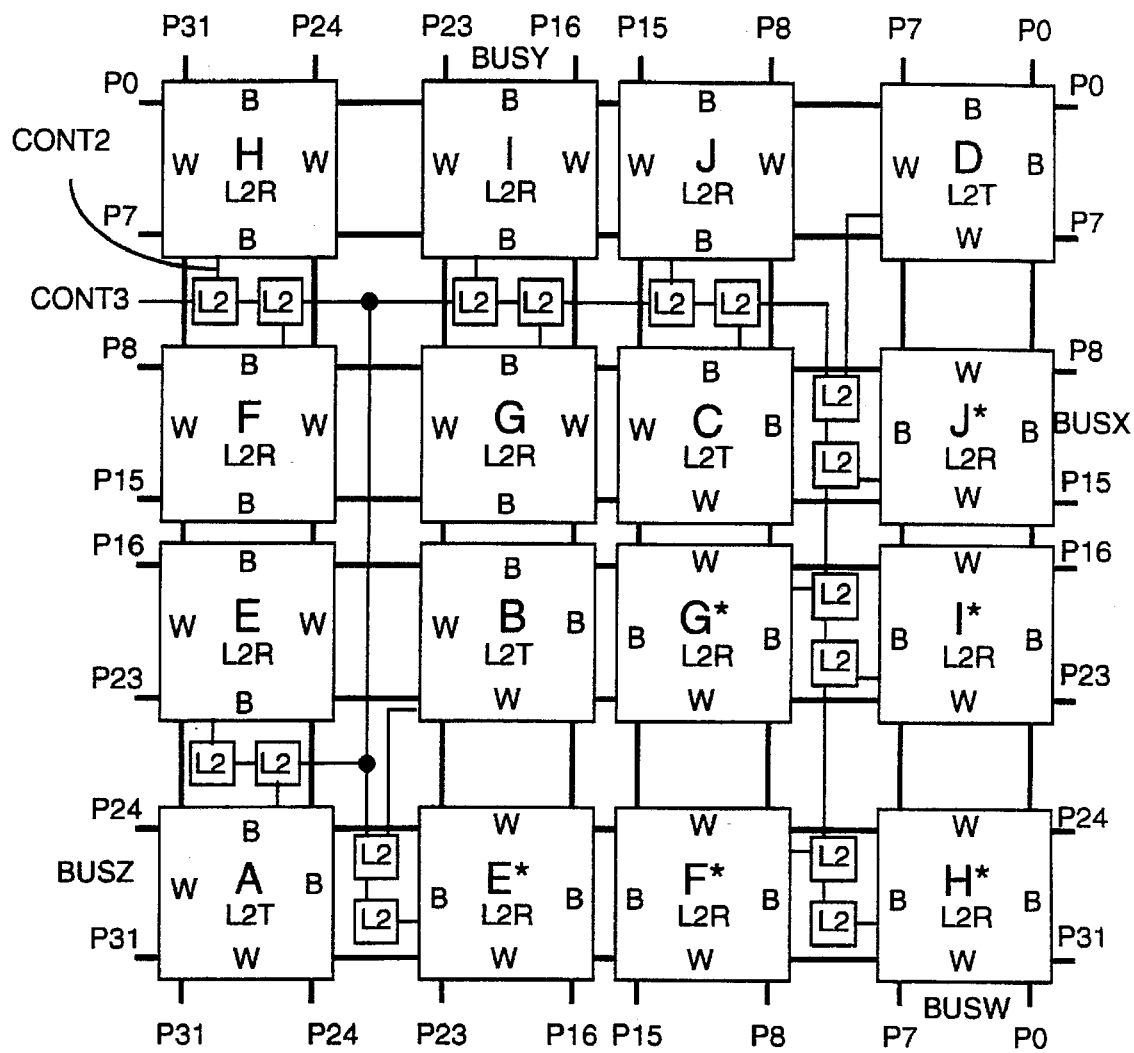
Figures 19B, 19C:
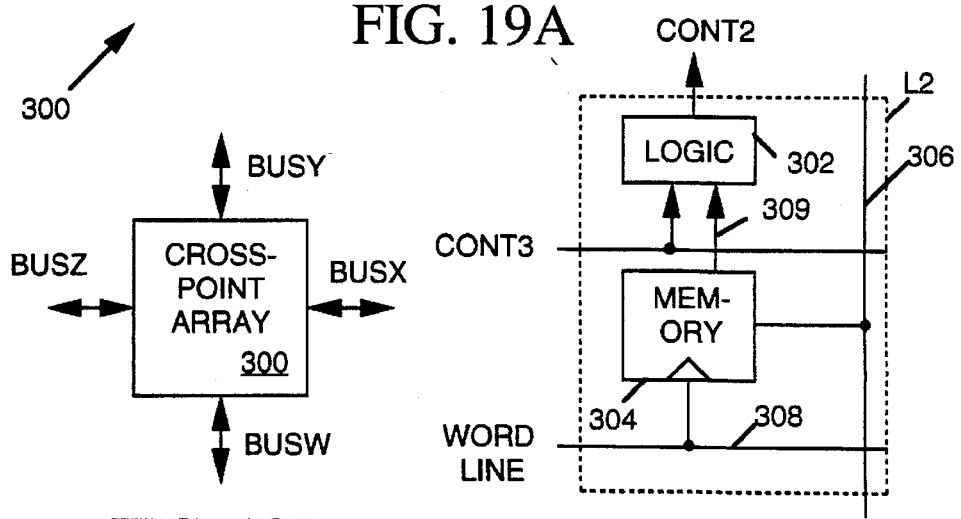
Figure 20:
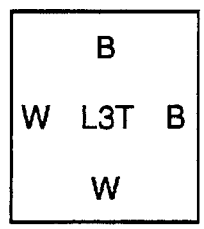
Figure 21:
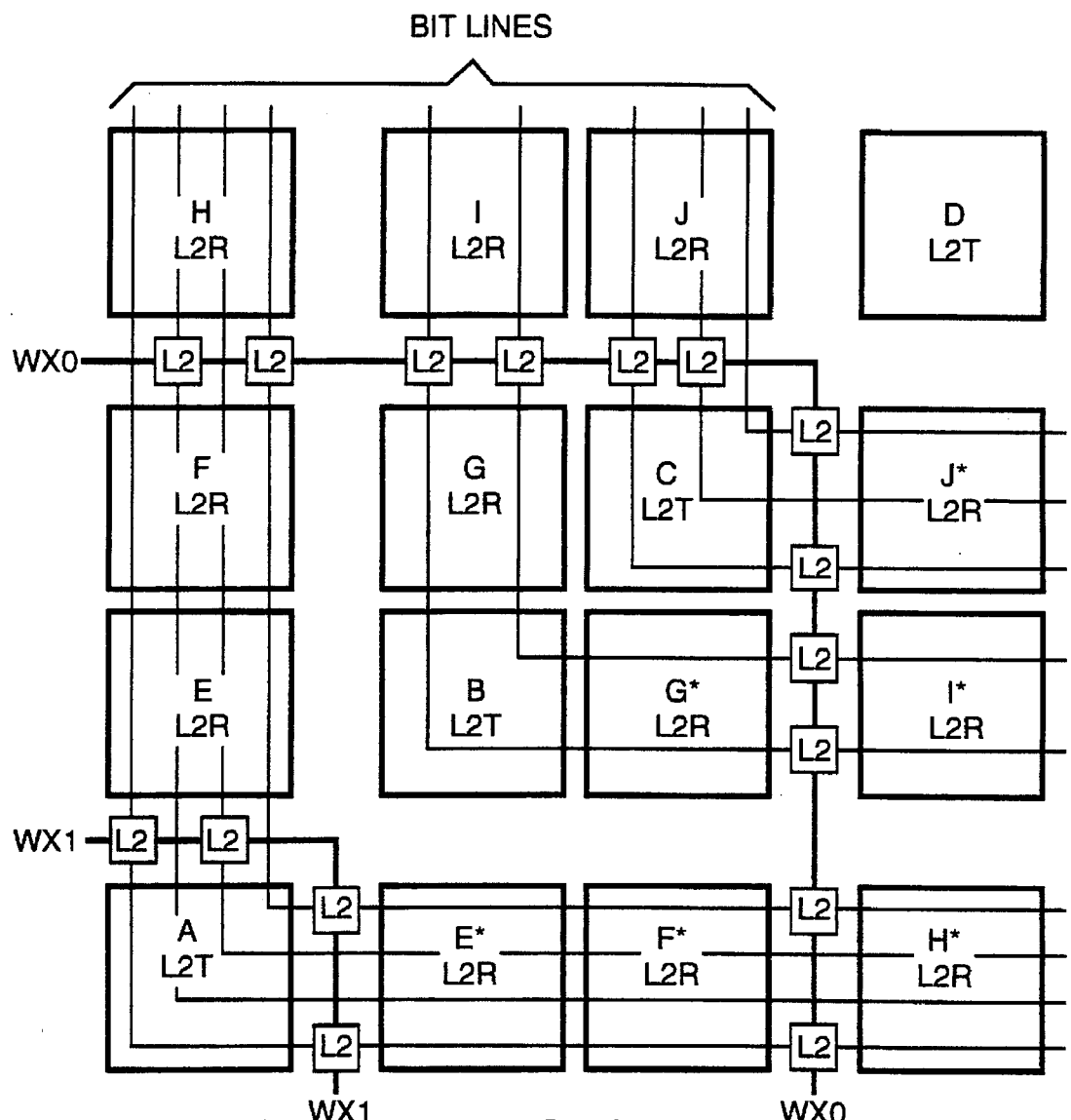
Figure 22:
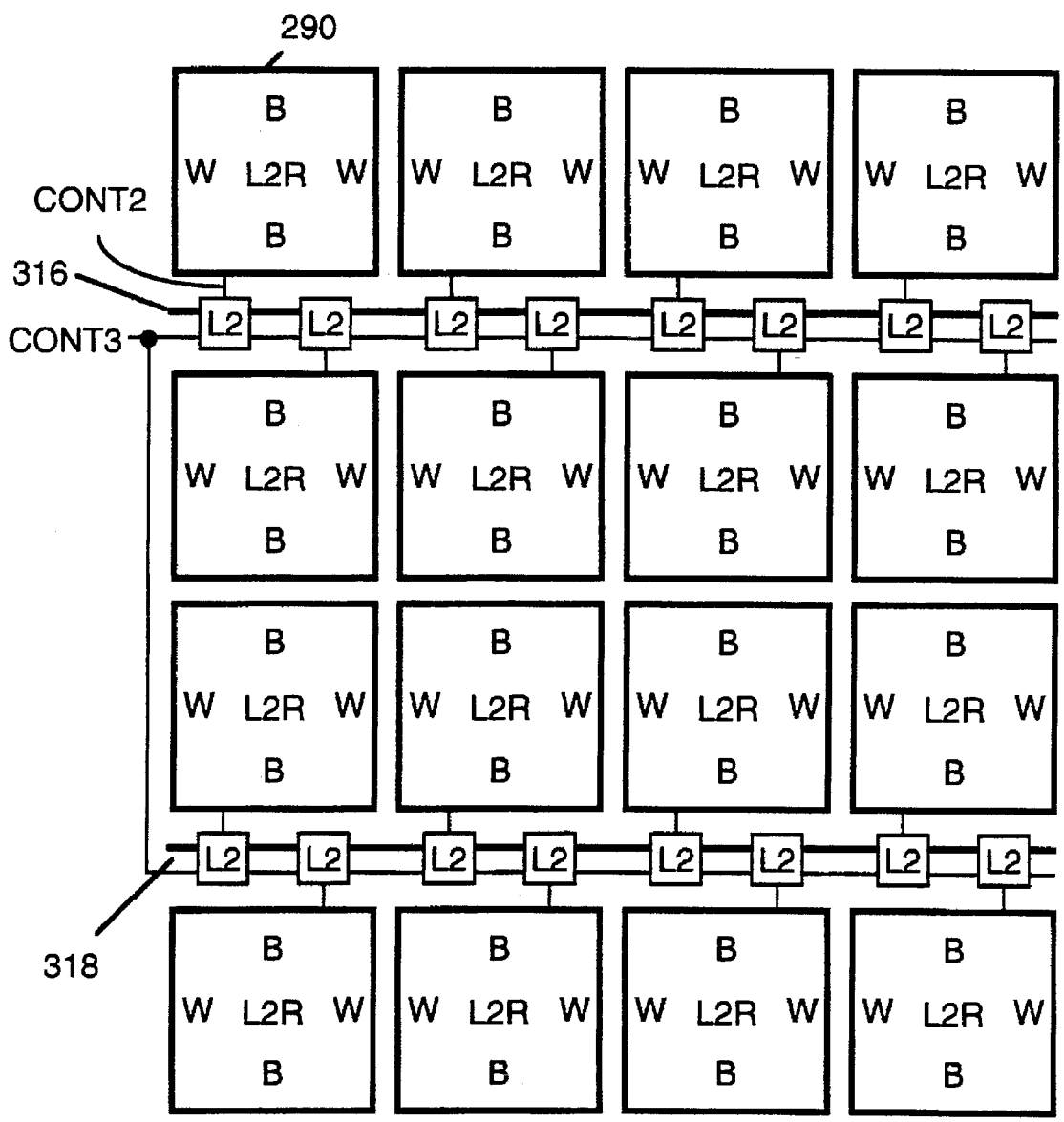
Figure 23:
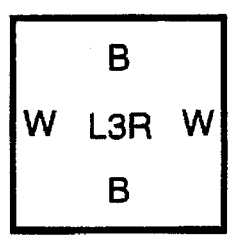
Figure 24:
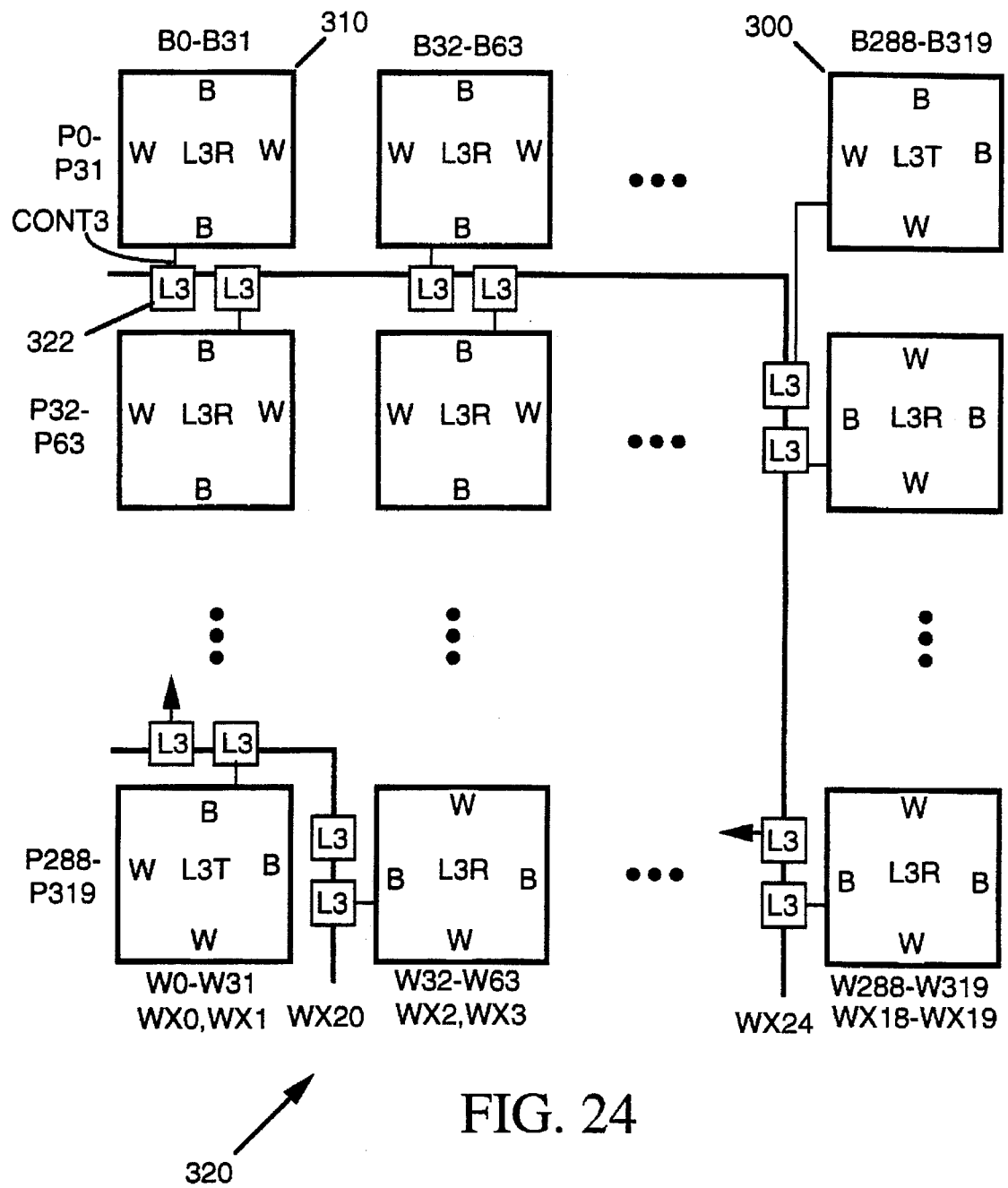
Figure 25A:
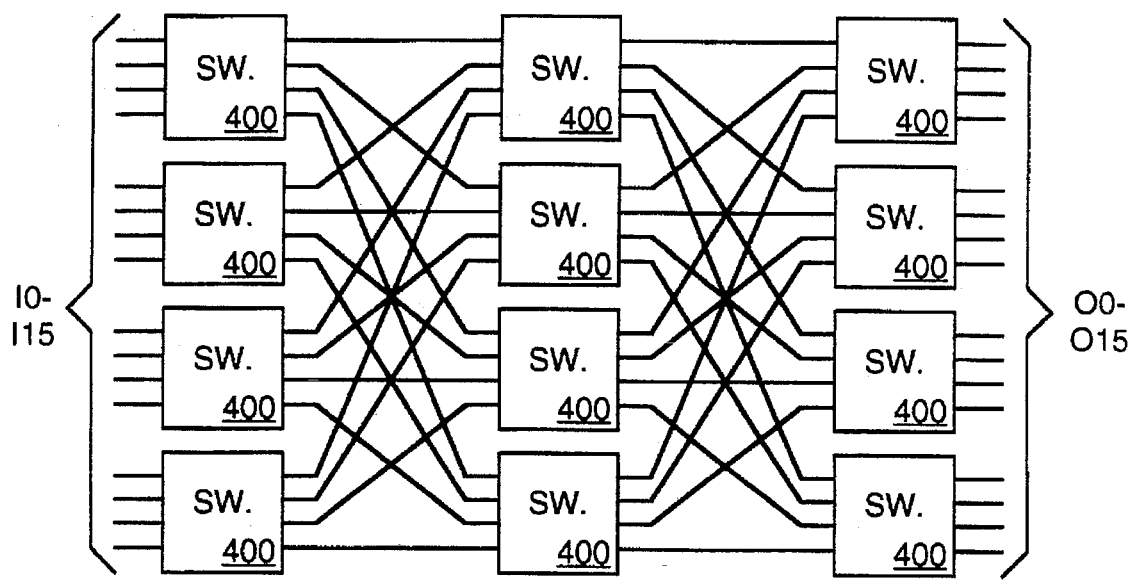
Figure 25B:
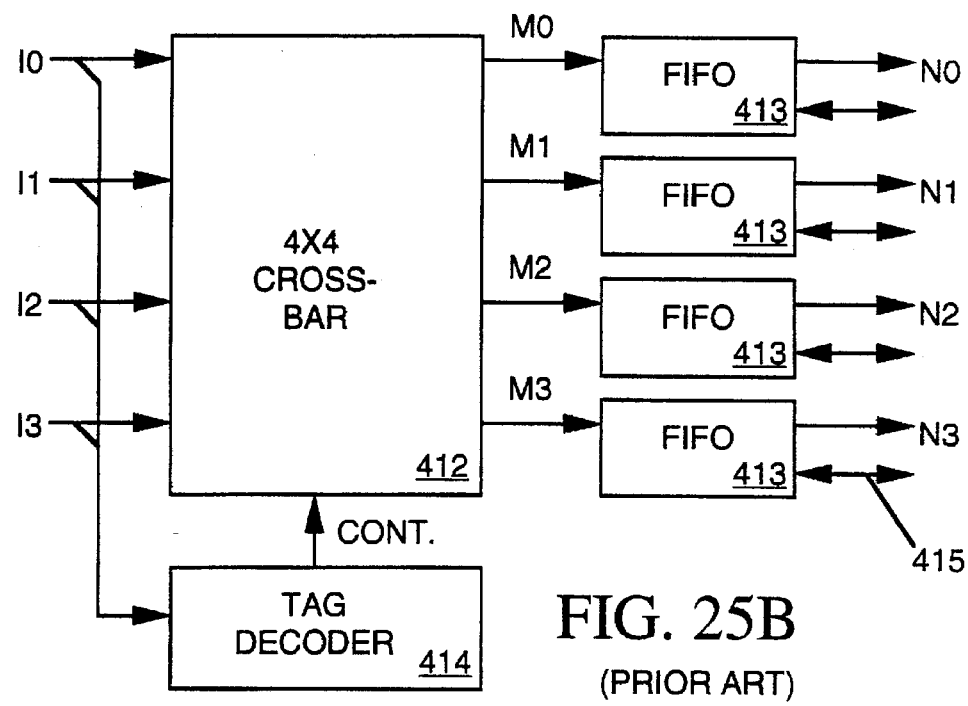
Figure 26:
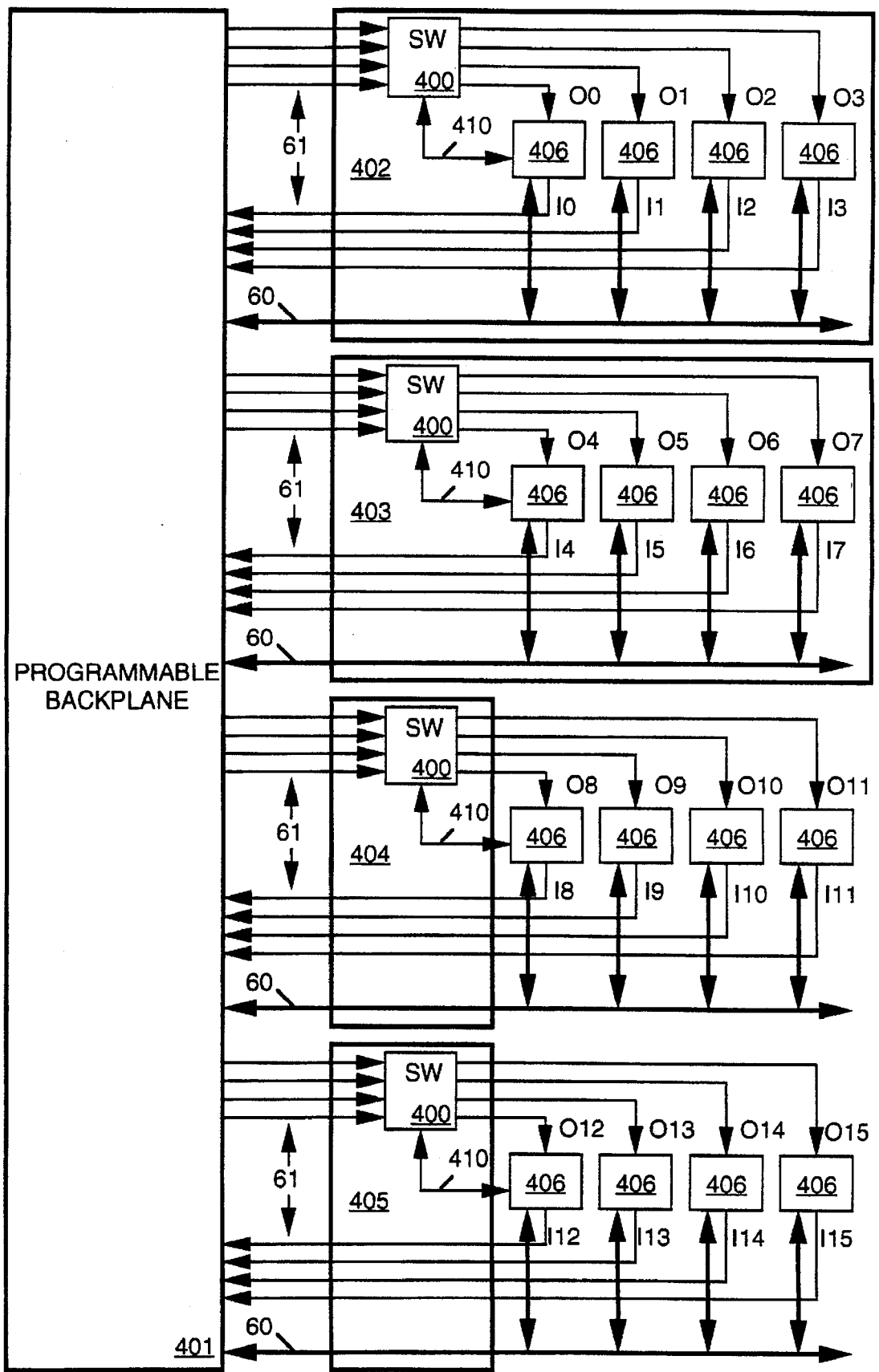
Figure 27:
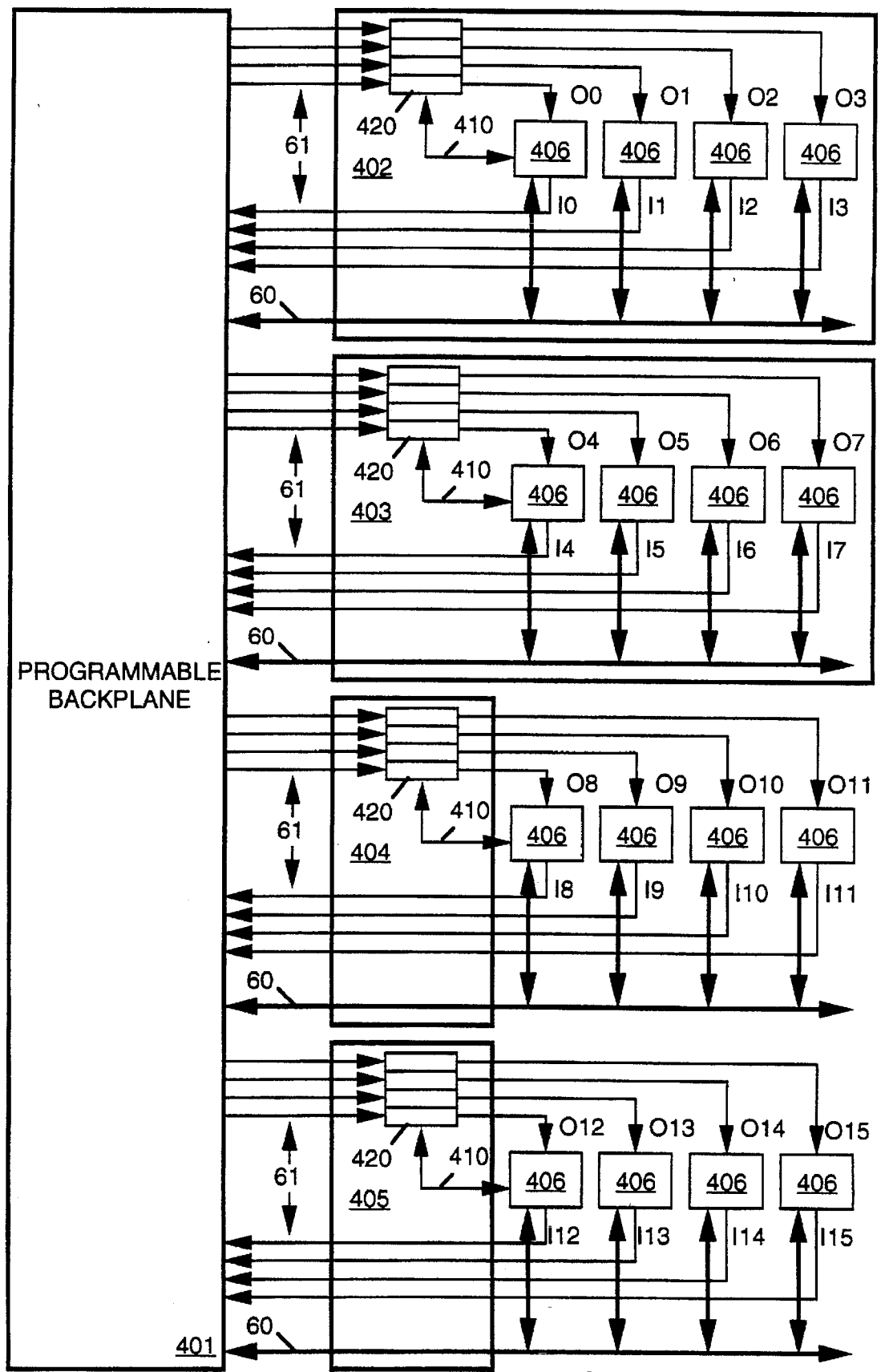
Figure 28:
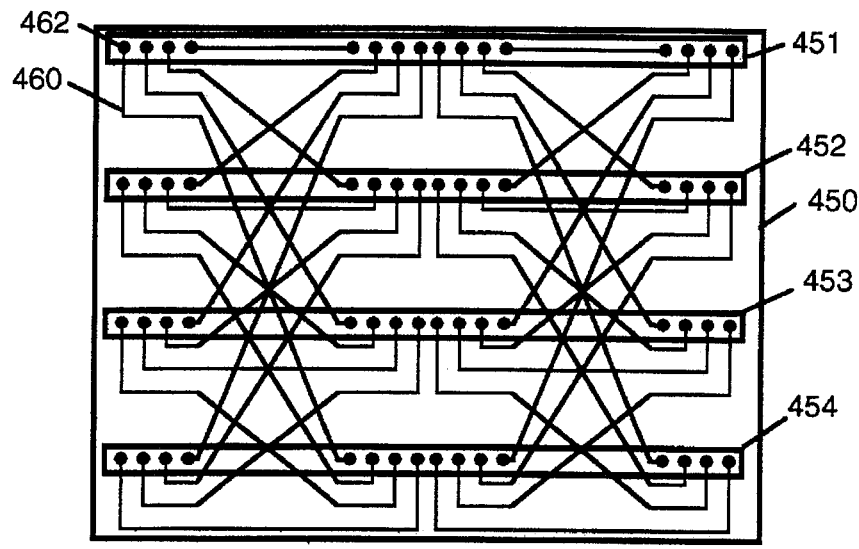
Figure 29:
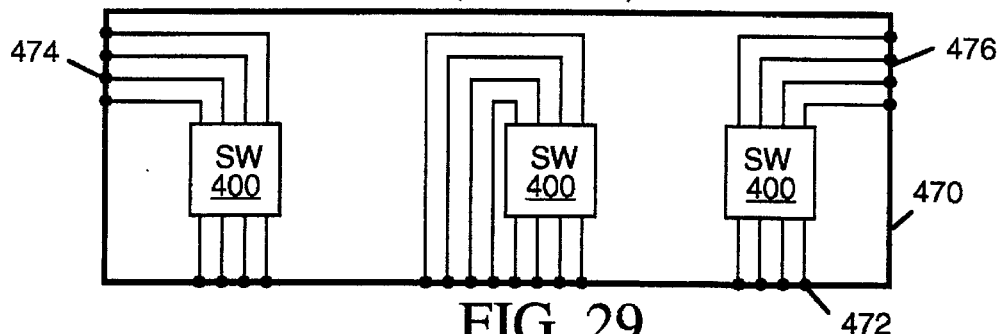
Figure 30:
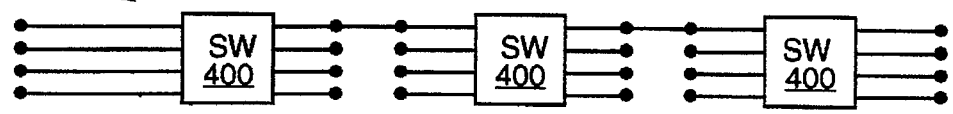
Figure 31:
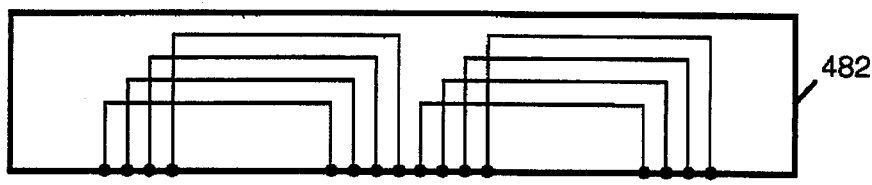
Figure 32:
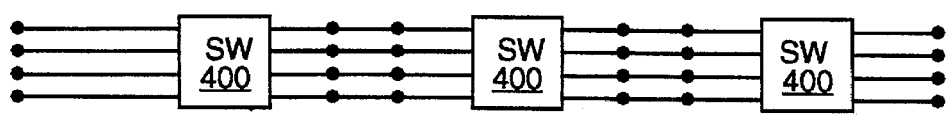
Figure 33:
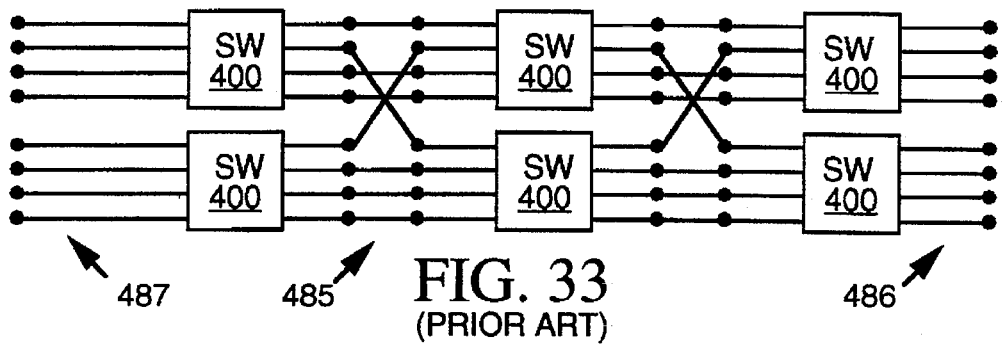
Figure 34:
Figure 35:
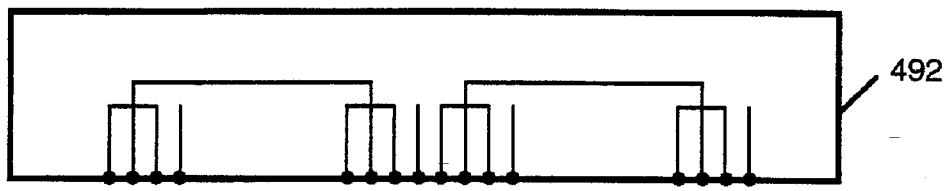
Figure 36:
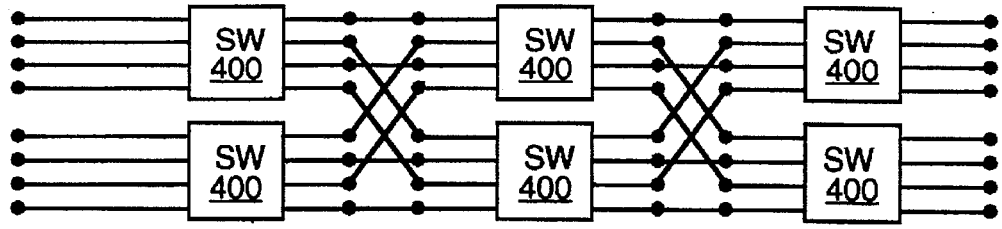
Figure 37:
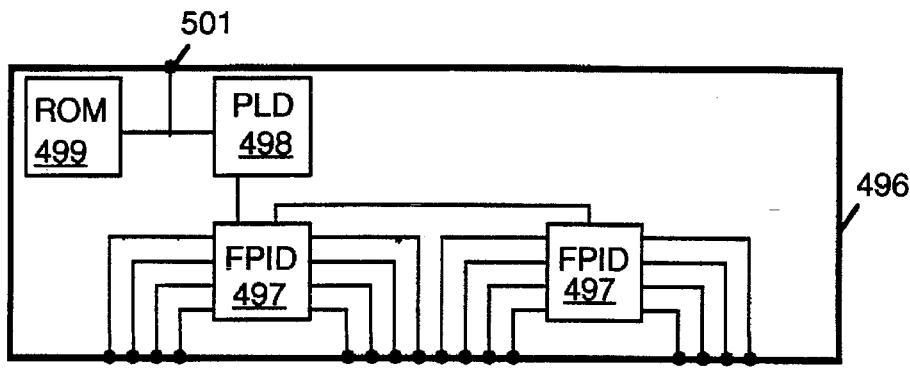
Figure 38:
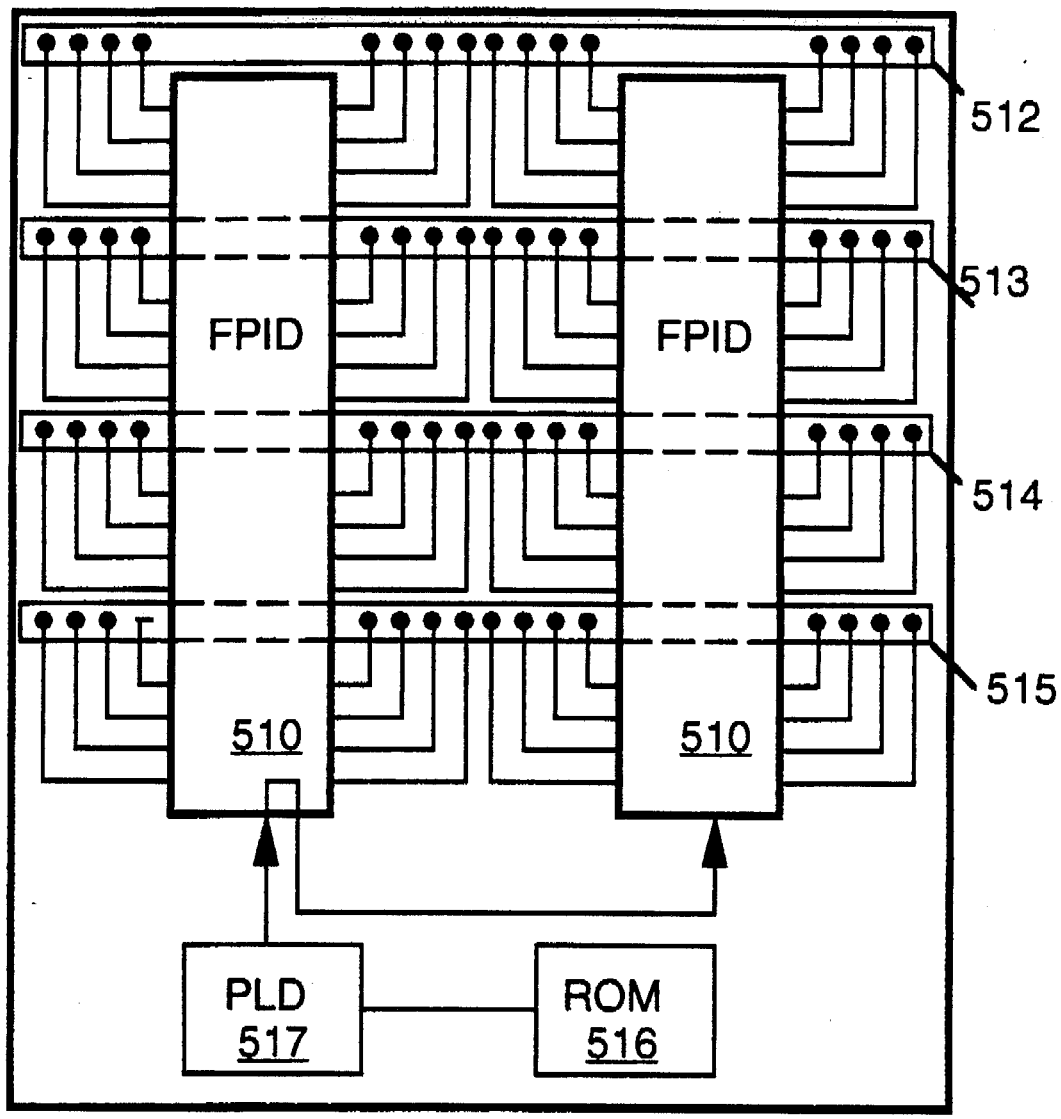

FIGS. 13A and 13B, when superimposed, form a block diagram illustrating an integrated circuit layout of a folded, hierarchical, triangular crosspoint array;

FIG. 13C is a plan view of the manner in which various cell types 262–265 are arranged on the surface of an integrated circuit;

FIG. 14 is a symbol representing the folded, triangular crosspoint array of FIGS. 13A and 13B;

FIGS. 15 and 16 illustrate in block diagram form level 1 cell types;

FIG. 17 illustrates in block diagram for a 4×8 folded rectangular crosspoint array;

FIG. 18 symbolically depicts the folded rectangular crosspoint array of FIG. 17;

FIG. 19A illustrates in block diagram form an integrated circuit layout for a three-level, hierarchical crosspoint array;

FIG. 19B is a block diagram illustrating the use of the crosspoint array of FIG. 19A in switching the buses;

FIG. 19C illustrates in block diagram form a typical level 2 control cell of FIG. 19A;

FIG. 20 is a symbol representing the level 3 triangular crosspoint array of FIG. 19A;

FIG. 21 illustrates in block diagram form the routing of selected word and bit lines through the second level control cells of the crosspoint array of FIG. 19;

FIG. 22 illustrates in block diagram form the integrated circuit layout of a Level 3 folded, rectangular crosspoint array;

FIG. 23 is a symbol representing the level 3 rectangular crosspoint array of FIG. 20;

FIG. 24 illustrates in block diagram form the integrated circuit layout of the four-level, folded, hierarchical crosspoint array of FIG. 10;

FIG. 25A illustrates in block diagram form a prior art clos network;

FIG. 25B illustrates in block diagram form details of a typical switch of FIG. 25A;

FIGS. 26 and 27 illustrate in block diagram form computer networks employing the programmable backplane of FIG. 4A;

FIG. 28 illustrates the layout of a prior art backplane for a multi-stage switching network;

FIG. 29 illustrates a layout for a prior art switch module for a multi-stage network;

FIG. 30 illustrates in block diagram form a prior art switching network;

FIG. 31 illustrates a layout of a prior art routing module card;

FIG. 32 illustrates in block diagram form a prior art switching network;

FIG. 33 illustrates in block diagram form a prior art switching network;

FIG. 34 illustrates a layout of a prior art routing module card;

FIG. 35 illustrates a layout of a prior art routing module card;

FIG. 36 illustrates in block diagram form a prior art switching network;

FIG. 37 illustrates a layout of a routing module card in accordance with the present invention; and FIG. 38 illustrates a layout of a motherboard implementing a programmable backplane in accordance with the present invention.

DESCRIPTION OF THE PREFERRED EMBODIMENT(S)

Backplane wiring for interconnecting printed circuit boards (PCBs) forming an electronic system may provide shared bus or point-to-point connecting between the PCBs. A shared bus interconnects all PCBs in parallel and provides a common communication path therebetween. Point-to-point backplane connections provide direct, non-shared communication paths between individual PCBs. Many backplanes provide both kinds of interconnections. In prior art systems, backplane interconnections are usually unchangeable, fixed in the form of conductive microstrips arranged on a motherboard to interconnect PCBs mounted on the motherboard. The signals routed by the backplane are buffered only by the PCBs themselves and are not buffered on the motherboard backplane itself as they flow between PCBs.

Figure 1A:
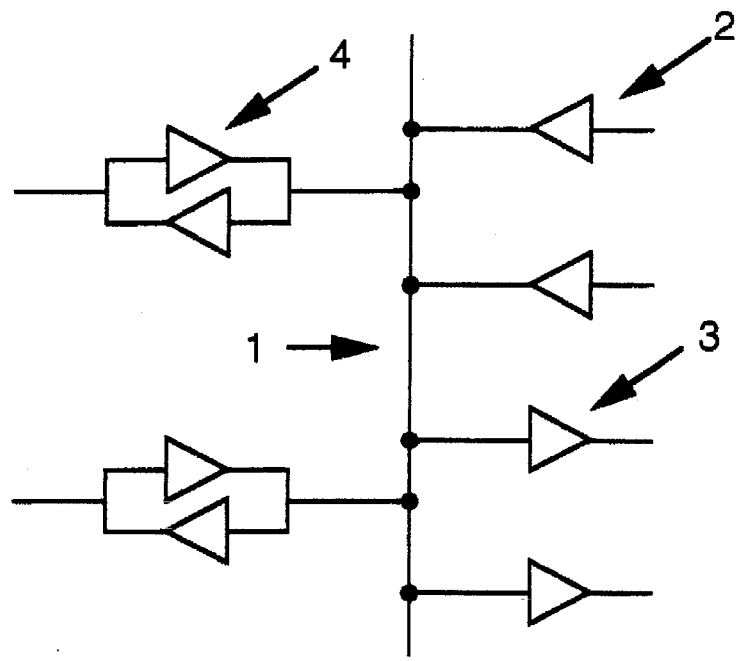
FIG. 1A is a block diagram illustrating various devices that may be connected to a line 1 of a shared bus.
Figure 1B:
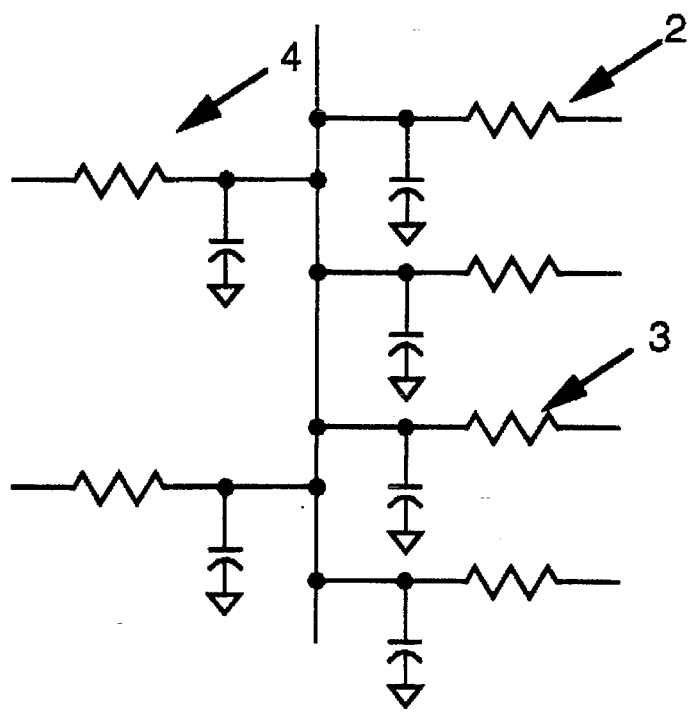
FIG. 1B is an equivalent impedance schematic diagram of the circuit of FIG. 1A.

FIG. 1A illustrates various devices that may be connected to a line 1 of a shared bus. FIG. 1B is an equivalent impedance diagram of FIG. 1A. As illustrated in FIGS. 1A and 1B, a line 1 of a shared bus may be connected to a large number of drivers 2, receivers 3 or transceivers 4, each contributing a capacitive load of approximately 5 pf, 10–12 pf and 15–20 pf, respectively. In addition the printed trace on the motherboard that form line 1 contributes another 1.5 pf/inch. The potentially large loading on a bus line, often adding up to 250–300 pf, can result in a delay of 12–15 ns which limit the performance of a shared bus backplane. For a given level of performance in terms of signal transmission speed, passive backplanes can serve only a limited number of components and the loading provided by each component must be carefully controlled.

A shared bus backplane has one advantage in that a PCB may be installed in any motherboard slot since each slot provides the same access to the shared bus. However the loading of shared buses makes them relatively slow and they require burdensome addressing schemes to route data between selected PCBs. In applications where high speed, dedicated communication between particular PCBs is needed, backplanes provide point-to-point connections between particular PCBs. Point-to-point connections are typically not as heavily loaded and can be operated at higher speeds than shared buses. However, since point-to-point interconnections between slots are fixed by the arrangement of conductors on the motherboard, the slot in which a PCB is inserted determines which other PCB it can communicate with. Any change in the routing of signals between PCBs requires a change in the motherboard conductor arrangement. The present invention improves the speed of shared buses and makes it relatively easy to quickly alter a shared or point-to-point backplane routing scheme by providing a backplane which programmably routes and actively buffers signals between PCBs.

Programmable Backplane

Figure 2:
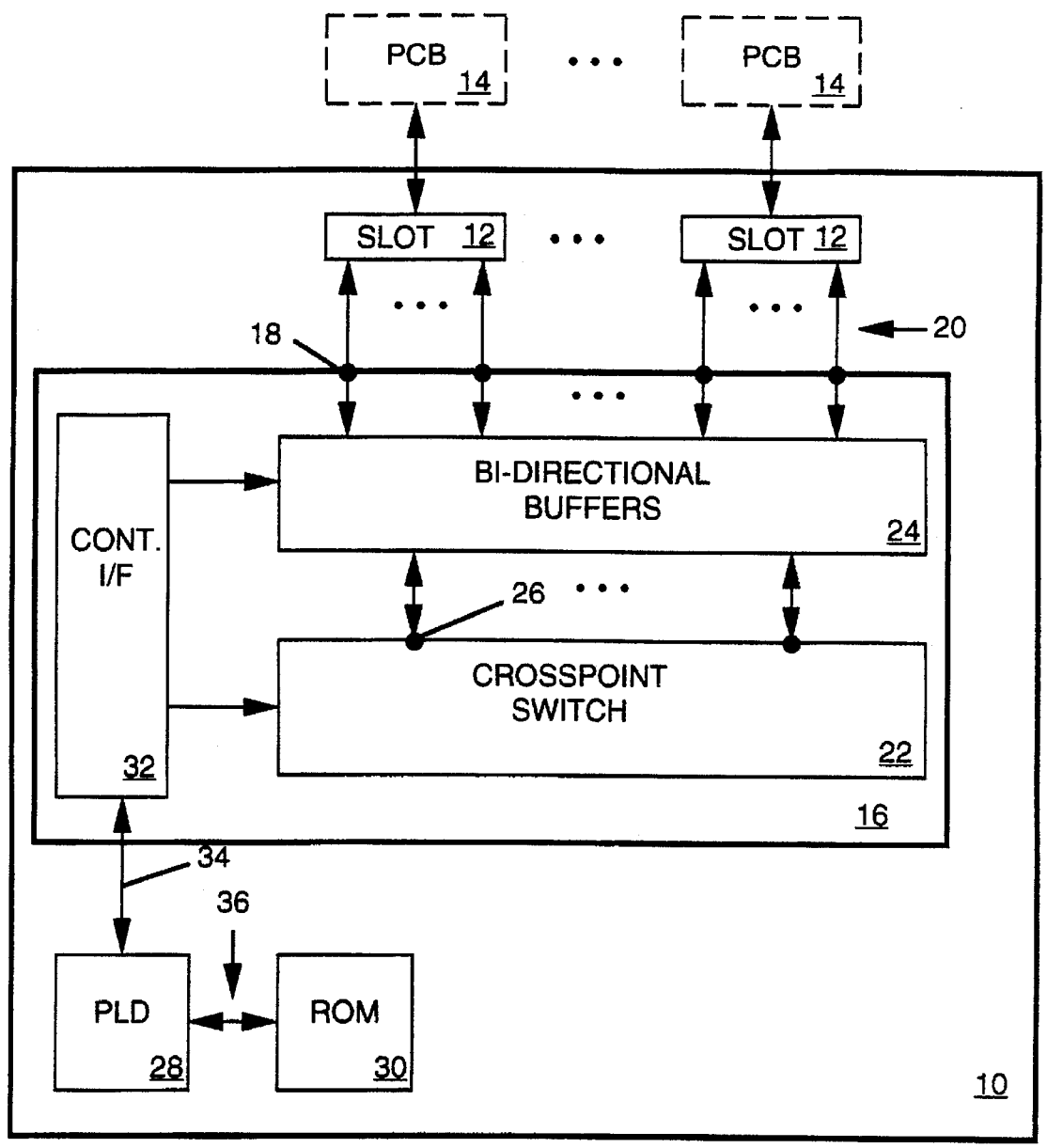
FIG. 2 is a block diagram illustrating a motherboard providing a programmable, switched backplane in accordance with the present invention.

FIG. 2 is a block diagram illustrating a motherboard 10 implementing a switched backplane in accordance with the present invention. Mounted on motherboard 10 are several slots 12 (conventional edge connectors) for receiving the edges of a set of printed circuit boards (PCBs) 14. Each slot 12 has a set of terminals which mate with contacts on the edge of a PCB 14 when the edge of a PCB is inserted in a slot 12. On the motherboard 10 are mounted a set of one or more field programmable interconnect devices (FPIDs) 16. For simplicity only one FPID 16 is shown in FIG. 2. The FPID 16 is an integrated circuit having a set of ports 18 connected to separate terminals of the various slots 12 through conventional microstrip conductors 20 formed on a surface of motherboard 10. Each FPID 16 includes an internal crosspoint switch 22 and a set of bi-directional buffers 24. Crosspoint switch 22 can be programmed to provide bi-directional digital or analog signal paths between any of its ports 26. Each bi-directional buffer 24 may be programmed to provide a digital or analog signal path between a port 26 of crosspoint switch 22 and an FPID port 18. When the signal being conveyed between a port 26 and a port 18 is a digital signal, the particular buffer 24 interconnecting them buffers the signal passing therebetween. When the signal passing between a port 26 and a port 18 is an analog signal, the buffer 24 provides a non-buffered signal path therebetween.

As used in the field of computer system design, the noun "buffer" sometimes refers to a "data buffer", a device for receiving, storing and retransmitting data. However as used in this specification and as used by others skilled in the signal transmission art, the noun "buffer" refers to a "signal buffer", a device that amplifies, regenerates and/or otherwise conditions an input signal to produce an output signal for transmission on a conductor. Herein, the verb "buffer" refers to what a signal buffer does. Also as used in this specification, the term "bi-directional signal" refers to a signal which at differing times may flow along a conductor between two nodes in opposite directions. A "bi-directional signal path" is a path which may convey a such bi-directional signal between two nodes. A "bi-directional buffer" is a signal buffer having two input/output ports and which can buffer a signal arriving at either port onto the other.

Referring again to FIG. 2, when a PCB 14 mounted in one of slots 12 transmits a signal to a terminal on the slot, that signal travels through a microstrip conductor 20 to a buffer 24. Buffer 24 actively buffers the signal onto a port 26 of crosspoint switch 22. Crosspoint switch 22 then routes the signal to another of its ports 26, the routing being determined by the manner in which crosspoint switch 22 has been programmed. The signal is then buffered by another of buffers 24 onto another conductor 20 which conveys the signal to another PCB 14 in another slot 12.

Motherboard 10 also includes a programmable logic device (PLD) 28 and a read only memory (ROM) 30 connected to PLD 28. A three-conductor bus 34, formed by microstrip conductors on motherboard 10, interconnects PLD 28 and all FPIDs 16 in series. On system startup PLD 28 simply reads programming data out of ROM 30 and serially transmits differing portions of the programming data to control interface circuits 32 within each FPID 16 via bus 34. The control interface circuit 32 in each FPID 16 responds to the programming data by setting crosspoint switch 22 to route signals between its ports 26 in a manner indicated by the programming data. Control interface circuit 32 also controls bi-directional buffers 24, setting each buffer to operate in one of various signal conditioning modes as indicated by the programming data from ROM 30. (The modes of operation of buffers 24 are discussed in detail herein below.)

Depending on the programming data stored in ROM 30 (which may also for example be a PROM, EPROM or EEPROM), FPID 16 can implement virtually any type of backplane scheme for interconnecting slots 12 including shared bus, point-to-point or a combination of both types of schemes. The backplane scheme can be changed simply by replacing or reprogramming ROM 30 so that the programming data residing therein indicates a different signal routing pattern for crosspoint switch 22.

Since the FPID 16 actively buffers the signal paths between PCBs 14, the capacitive load that must be driven from each PCB node (the input impedance of a buffer 24 in combination with the impedance of a conductor 20) is constant, typically about 12 pf, and relatively small even for shared bus systems. This makes it easy to optimize the design of drivers and receivers in the PCBs; the optimal driver design will be the same regardless of how the interconnections between PCB nodes are arranged. The FPID 16 may be programmed to fan out signals internally but it adds only about 500 ps of signal delay for each additional connection to a backplane node. The data transfer rate of a shared bus implemented by FPID 16 can be much greater than for a typical passive bus implemented by traces on the motherboard. Thus the active backplane provided by the present invention is useful in systems having large numbers of PCBs accessing a shared bus.

Also since the node interconnections provided by the FPID 16 may be easily changed by reprogramming or replacing ROM 30, point-to-point interconnections between PCBs 14 may be altered without altering the motherboard hardware other than ROM 30. The present invention is thus also useful, for example, for implementing a backplane in a prototype system or in any system where a backplane design can be expected to evolve over time.

Motherboard Layout

Figure 3A:
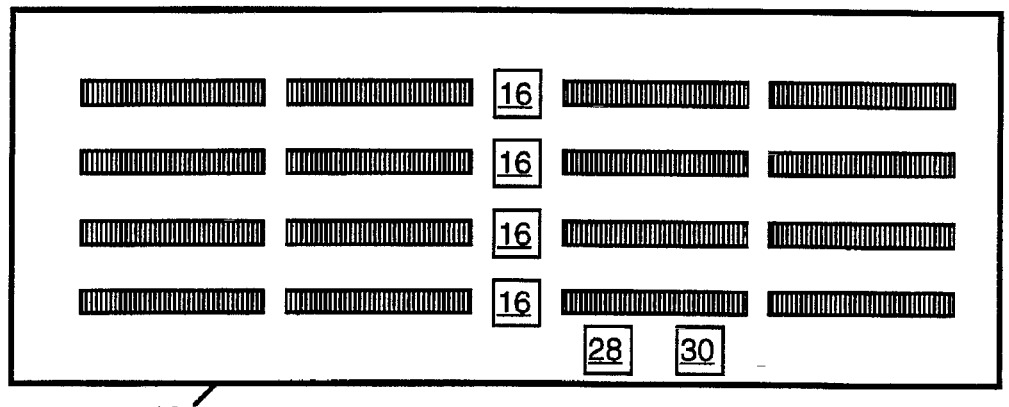
FIG. 3A illustrates in plan view an example layout for the motherboard of FIG. 2.
Figure 3B:
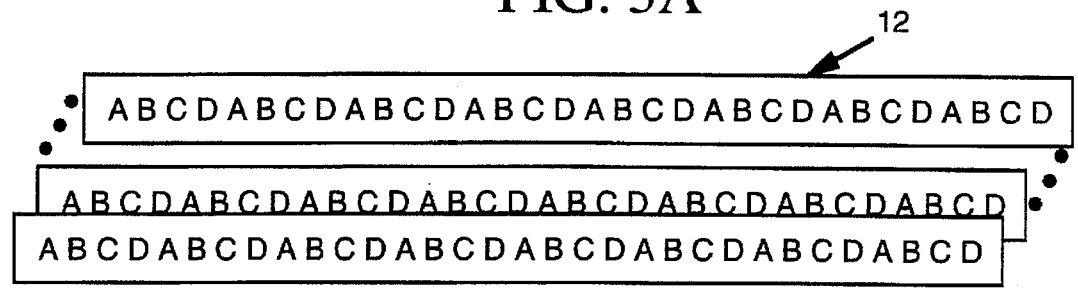
FIG. 3B illustrates in block diagram form an example of suitable microstrip interconnections between the various components of the motherboard FIG. 3A.
Figure 3B:
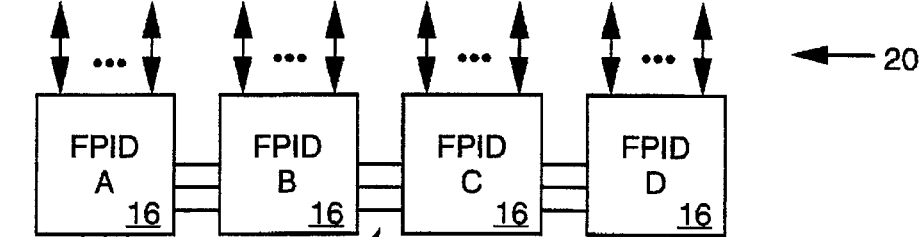

FIG. 3A illustrates in plan view an example layout for a motherboard 10 implementing a programmable backplane in accordance with the present invention. FIG. 3B illustrates in block diagram microstrip interconnections between the various components of motherboard 10 of FIG. 1. The number of FPIDs needed in any system depends on the number of terminals in slots 12 and the number of ports in each FPID 16. In the example of FIGS. 3A and 3B, four 128-port FPIDs 16 are needed to interconnect sixteen slots 12. The 16 slots 12 are arranged in a 4×4 array on the surface of board 10. The four FPIDs 16, along with PLD 28 and ROM 30 are also mounted on board 10. The 16 slots 12 each have 32 terminals, repetitively labeled "A" through "D," and the four FPIDs 16 are labeled through "D". The terminal slots 12 are connected by microstrips 20 (formed on the surface of the motherboard) to the ports of the four FPIDs 16. All terminals labeled "A" are tied to separate ports of FPID A, all terminals labeled "B" are tied to separate ports of FPID B, and so on. PLD 28 and FPIDs 16 are interconnected through microstrip conductors implementing the bus 34. The PLD 28 communicates with ROM 30 through microstrip conductors implementing bus 36.

Figure 3C:
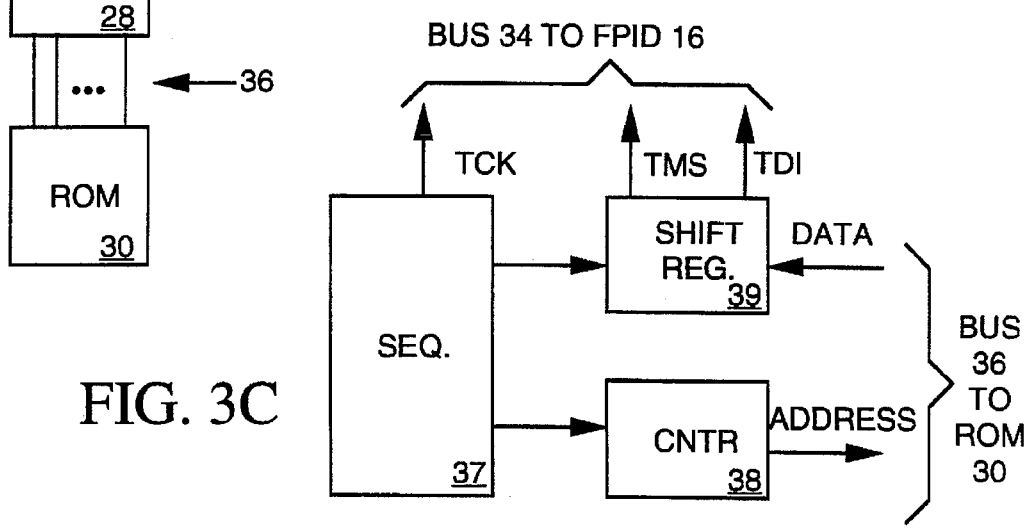
FIG. 3C illustrates in block diagram form a circuit implemented by the programmable logic device of FIG. 2.

FIG. 3C illustrates in block diagram form a circuit implemented by PLD 28 of FIG. 2. On system startup a sequencer 37 transmits a sequence of pulses to a counter 38. Counter 38 responds by providing a sequence of addresses to ROM 30 of FIG. 2. To each address ROM 30 returns a data word to a parallel-in/serial-out shift register 39. In response to clocking signals from sequencer 37, shift register 39 serially transmits each data word to FPIDs 16 via a pair of serial signals TDI and TMS. Sequencer 37 also provides a signal TCK which together with TMS provide asynchronous handshaking with FPID 16 in a manner described herein below.

Dynamically Switched Backplane

The backplane provided by the apparatus of FIG. 2 is programmable in that we can alter signal routing paths between slots 12 by altering the programming data in ROM 30. However after system start up, and after PLD 28 reads the programming data out of ROM 30 and uses it to program FPID 16, backplane signal routing cannot be changed without changing ROM 30 and restarting the system. In some applications it may be desirable to permit the signal routing provided by a backplane to be changed dynamically after initial programming following system startup. For example when PCBs 14 each provide interface circuitry for remote computers and the backplane system of FIG. 2 could provide a fixed, shared bus backplane between all PCBs 14 through which the computers may communicate with one another. But system throughput would be improved if the backplane could be altered as needed to provide direct point-to-point communication paths between those PCBs 14 that need to communicate with one another at any given moment.

FIG. 4A illustrates in block diagram form an alternative embodiment of the invention, a programmable backplane for interconnecting a set of PCBs 44. The backplane system of FIG. 4A has many features in common with the backplane system of FIG. 2 but has some differences which allow signal routing to be dynamically altered following system start up in response to instructions from the PCBs 44 themselves. The backplane system includes a motherboard 40 having a set of slots 42 similar to slots 12 of FIG. 1 for receiving the PCBs 44. Also mounted on the backplane are one or more FPIDs 48 for providing signal routing between slots 42. (For simplicity, only one FPID 48 is shown in FIG. 4A.) A ROM 44 and PLD 46 are provided to initially program FPIDs 40 upon system start up in the same way ROM 30 and PLD 28 operate to program FPIDs 16 of FIG. 2.

FPIDs 48 are somewhat similar to FPIDs 16 of FIG. 2 but have some modifications which permit FPIDs 48 to dynamically, and very rapidly, alter routing of signals between slots 42 after initial programming by PLD 46. The changes in signal routing are made in response to instructions from computers or other instruction source 56 mounted on or connected to circuit boards 44. FPID 48 includes bi-directional buffers 50 similar to buffers 24 of FIG. 2. Buffers 50 are connected to terminals in slots 42 via microstrip conductors 61 and to ports 65 of a "hierarchical" crossbar switch 52 via conductors 63. Buffers 50 bi-directionally buffer signals transmitted between slots 42 and switch 52. A control interface circuit 54 programs switch 52 to route signals between its ports 65.

During system startup PLD 46 transmits programming data from ROM 44 to interface circuit 54 which initially programs switch 52 similar to the way in which circuit 32 of FIG. 2 programs FPIDs 16 in response to data from PLD 28. However, control interface circuit 54 can thereafter dynamically change signal routing within switch 52 in response to a 24-bit routing instruction received from any instruction source 56 on a PCB 44 or otherwise having access to a slot 42 via of a PCB 44. Motherboard 40 includes a 24-bit parallel bus 60 which interconnects 24 of the pins of every slot 42 on the motherboard. Some of buffers 50 buffer the instructions conveyed on bus 60 onto a parallel bus 62 within FPID 48. Bus 62 delivers the instructions to control interface circuit 54.

When the programmable backplane system of FIG. 4A is operating in a dynamic switching mode, any instruction source 56 may transmit a 24-bit routing instruction to interface circuit 54 via the path established by bus 60, buffers 50 and bus 62. Interface circuit 54 responds by generating and transmitting programming data to switch 52 causing the switch to alter its signal routing in a manner indicated by the instruction. Thus the signal routing provided by the backplane system of FIG. 4A may be dynamically reconfigured after system startup by any instruction source 56 capable of sending a 24-bit instruction over bus 60 via a slot 42.

As will be described in detail herein below, a routing instruction delivered in a single cycle of bus 60 can tell FPID 48 to make or break a specific routing connection between any two ports 65. However, the data PLD 46 sends to FPID 48 not only indicates an initial backplane signal routing pattern, but also may indicate several other routing patterns. The FPID 48 stores data representing those other routing patterns and can switch between those routing patterns in response to the routing instructions. Thus a routing instruction can also in a single cycle of bus 60 tell FPID 48 to switch between various predetermined backplane routing patterns by making and/or breaking large numbers of routing paths between PCBs 44.

Figure 4B:
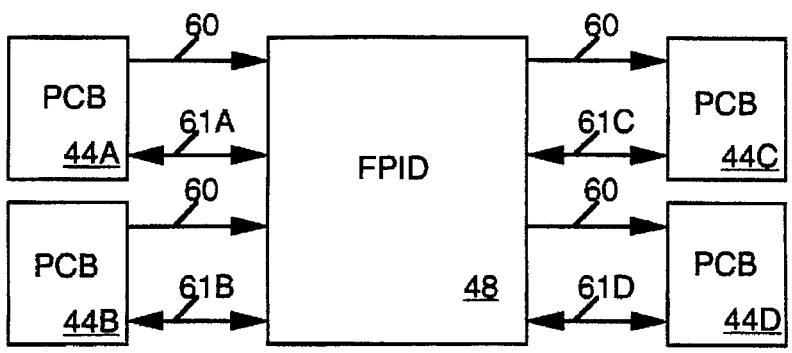
FIG. 4B illustrates in block diagram form a set of four printed circuit boards communicating through the motherboard of FIG. 3A.

For example in an application illustrated in FIG. 4B, a set of four PCBs 44A–44D communicate through corresponding 32-bit parallel buses 61A–61D connected to FPID 48. When one PCB (for example PCB 44A) wishes to communicate with another PCB (for example PCB 44B) it transmits a single routing instruction to FPID 48 via bus 60. Motherboard 40 responds by establishing a connection between bus 61A and 61B according to one of its predetermined routing patterns. Thereafter, when PCB 44A has completed its communication with PCB 44B, it may transmit an instruction via bus 60 telling FPID 48 to select a different routing pattern. FPID 48 thereupon breaks the connection to bus 44B and establishes a new connection with bus 44C and/or bus 44D. Since only one instruction is needed to select between predetermined routing patterns, the bus switching operations can be conducted with very little overhead on the part of PCB 44A. Also, FPID 48 carries out the bus switching operation rapidly and PCB 44A does not have to wait long to begin data transmission.

Backplane Arbitration

Referring again to FIG. 4A, the backplane includes an arbitration scheme to prevent PCBs 44 from transmitting conflicting routing instructions to FPID 48 via bus 60. A random access memory (RAM) 58 is provided on motherboard 40, and any PCB 44 may read or write access RAM 58 through bus 60. RAM 58 stores a table indicating the current busy status of the ports FPID 65. When one PCB 44 wishes to communicate with another PCB 44, it periodically checks data in RAM 58 to determine whether the FPID ports to which the PCBs are connected are available. When the ports are available, the first PCB 44 stores data in RAM 58 indicating the ports are busy and then transmits an instruction to FPID 48 telling it to establish the desired signal path between the switch ports 65. Thereafter the two PCBs 44 may communicate through the new path. When the communication is over, the first or second PCB 44 transmits an instruction causing switch 52 to break the communication path and then stores data in RAM 58 indicating the switch ports are no longer busy.

Hereinbelow are discussed details of construction of FPID 16 of FIG. 2 and FPID 48 of FIG. 4. FPID 16, depicted in FIGS. 5–9, is discussed first. FPID 48, depicted in FIGS. 10–24, is discussed thereafter.

Field Programmable Interconnect Devices

Figure 5:
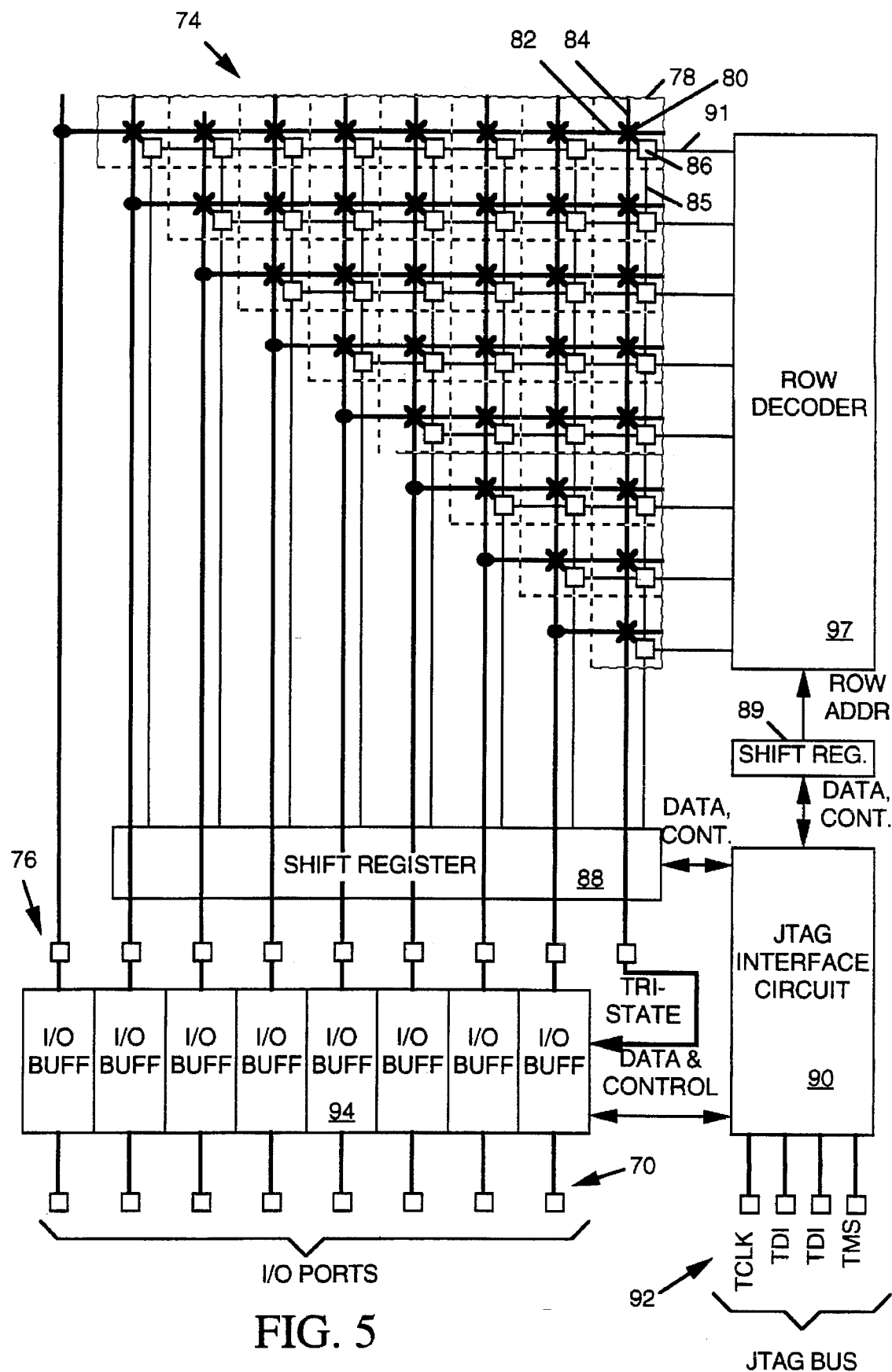
FIGS. 5 and 6 illustrate the field programmable logic device of FIG. 2 in simplified block diagram form.

FIG. 5 illustrates the FPID 16 of FIG. 2 in simplified block diagram form. In the preferred embodiment of the invention, FPID 16 is a 208-pin integrated circuit. Of these 208 pins, 160 pins provide input/output ports 70 for signals to or from other parts of the motherboard 10 of FIG. 2. In FIG. 5, only 8 ports of the total 160 are shown. FPID 16 also includes a 176-port cross-point switch 74. Switch 74 can selectively connect any one of its 176 ports 76 to any one or more of its other ports. In FIG. 5, only 9 switch array ports 76 of the total 176 are shown. Switch 74 comprises a triangular array of 176 rows and columns of cross-point switch cells 78. (For simplicity, only 8 rows and 9 columns are shown in FIG. 5.)

Each switch cell 78 consists of a switch 80 and a memory cell 86. Switch 80 selectively interconnects one horizontal signal line 82 with one vertical signal line 84. Memory cell 86 stores a single data bit. The state of the stored data bit controls the state of switch 80. When the stored bit is high, the switch connects the horizontal and vertical signal lines 82 and 84 passing through the cell but when the stored bit is low, the vertical and horizontal signal lines are disconnected. Each horizontal signal line 82 passes through all cells 78 of a separate array row, and each vertical signal line 84 passes through all cells 78 of a separate array column. Each one of the horizontal signal lines 82 and each one of the vertical signal lines 84 are hardwired to a corresponding one of the 176 array ports 76 of the cross-point switch 74.

By placing the appropriate data bits in the memory cells 86 of switch cells 78, any array port 76 may be connected to any other port or set of array ports 76. A separate data bit is concurrently supplied as input to the memory cells of each cell column through data outputs 85 of a 176-bit shift register 88. A JTAG interface circuit 90 shifts 176 data bits from an IEEE standard 1149.1 "JTAG" bus into shift register 88. JTAG interface circuit 90 also stores a row address received via the JTAG bus in a shift register 89. A row decoder 97 decodes the row address stored in shift register 89 to input enable the memory cells 86 of one row of switch cells 78 via one of memory control lines 91 supplied in parallel to each memory cell of a row so that each memory cell of the row stores a separate one of the 176 data bits from shift register 88. To program the entire switch, the process of storing data in shift register 88 and input enabling a row of memory cells is repeated for each of the 176 cell rows of the cross-point array. A set of 160 input/output buffers 94 interconnect the 160 FPID I/O ports 70 with 160 of the 176 array ports 76 of cross-point switch 74. Eight of the 176 array points 76 provide tristate control inputs TS0–TS7 to I/O buffers 94.

Figure 6:
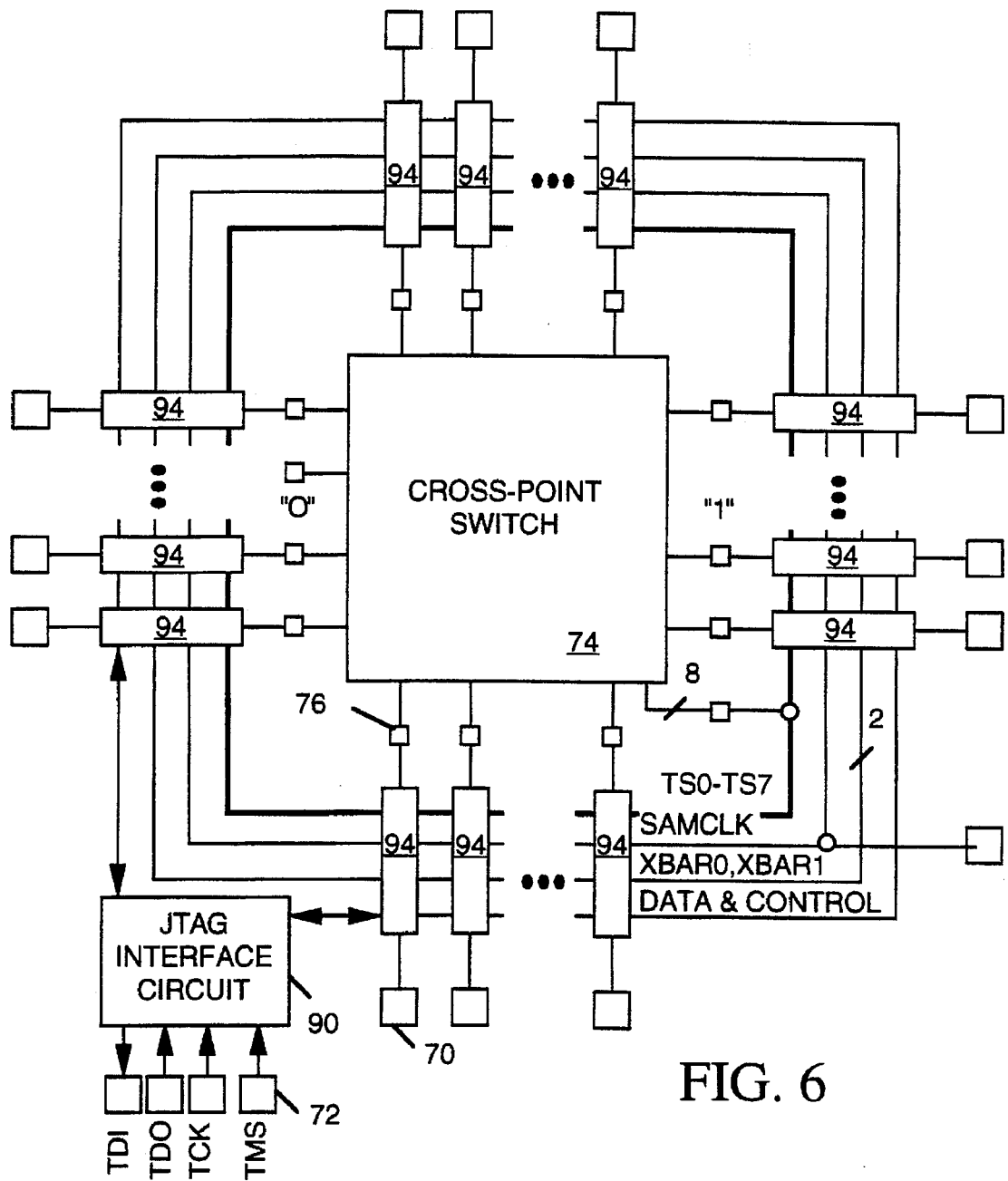

FIG. 6 also shows portions of FPID 16 in simplified block diagram form so as to detail interconnections between buffers 94 and JTAG interface circuit 90. Shift registers 88 and 89 and row decoder 97 shown in FIG. 5 are omitted in FIG. 6.

In FIG. 6, I/O buffers 94 are shown surrounding cross-point switch 74 and connecting FPID I/O ports 70 to ports 76 of cross-point switch 74. High ("1") and low ("0") logic levels drive an additional pair of cross-point switch array ports 76. Eight ports 76 of switch 74 drive tristate control lines TS0–TS7 connected in parallel to each of I/O buffers 94 and a clock signal SAMCLK applied to another I/O port 70 is connected in parallel to each I/O buffer 94 to control data sampling in a manner described herein below. A pair of "outer cross-bar" lines XBAR0 and XBAR1 is also connected in parallel to all I/O buffers 94. Switches in each buffer 94 can be programmed to connect their pin side port 70 to either the XBAR0 or XBAR1 wherein the XBAR1 and XBAR0 lines facilitate testing of the FPID. The JTAG bus signal lines TDI, TDO, TCK and TMS are tied to four pins 72 connected to JTAG interface circuit 90. Control and data outputs of interface circuit 90 are connected in parallel and serial fashion to all of the I/O buffers 94.

Figure 7:
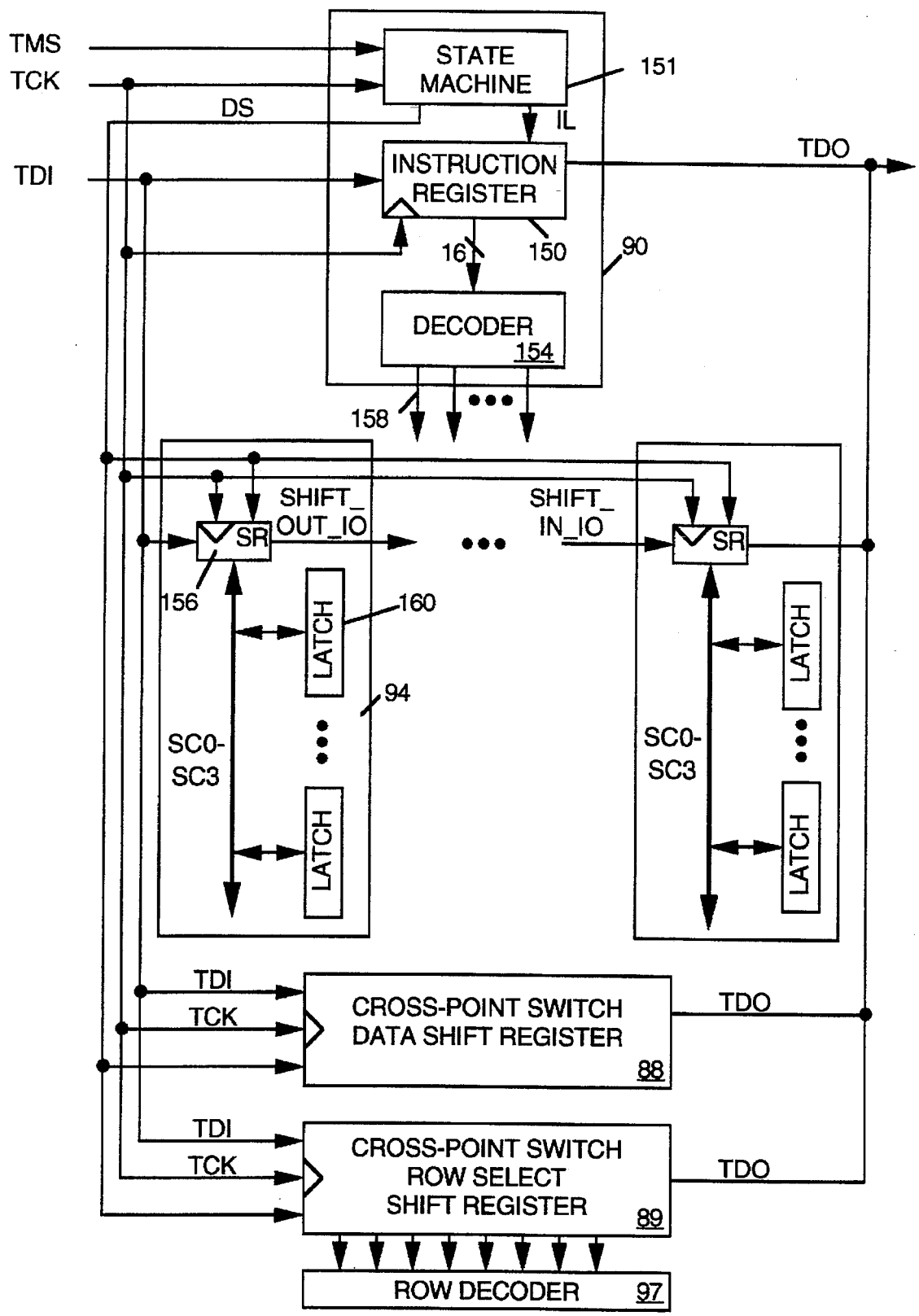
FIG. 7 illustrates in block diagram form the JTAG interface circuit of FIG. 6.

FIG. 7 illustrates the JTAG interface circuit 90 of FIGS. 5 and 6. The JTAG bus arrives at the FPID from PLD 28 via bus 34 of FIG. 2 The JTAG bus is intended for transmitting and sending serial data to and from digital circuit boards. Each FPID 16 port selectively provides any of several types of buffering and each FPID can introduce an adjustable amount of port-to-port delay in signals passing through the device. The four JTAG lines are Test Data In (TDI), Test Data Out (TDO), Test Clock (TCK) and Test Mode Select (TMS). All devices on the bus (i.e. all FPIDs) are connected in series with the TDO pin of one device connected to the TDI pin of the next.

The TMS signal is supplied as input to a state machine 151 clocked by the TCK signal. The TMS signal indicates whether the JTAG bus is in an instruction loading or data shifting phase of operation. In accordance with the IEEE JTAG bus standard, state machine 151 asserts an IL signal during the instruction loading phase and asserts the DS signal during the data shifting phase of JTAG bus operation.

During the instruction loading phase, PLD 28 of FIG. 2 shifts a 16-bit instruction via the TDI line into a serial instruction register 150 in the JTAG interface circuit 90 that is input enabled by the IL signal from state machine 151. The TCK signal clocks the instruction data into register 150. This instruction is decoded by a decoder 154 which supplies read or write control signals 158 to latches, buffers and other devices within the FPIDs 16. The data stored in these devices controls FPID operation.

The control signals produced by decoder 154 select devices 160 in FPID I/O buffers 94 to read or write access a 4-bit bus SC0–SC3 connected to a parallel input of a 4-bit shift register 156, also included in each FPID I/O buffer 94. The 4-bit shift registers 156 of all FPID buffers are connected in series. During a data shifting phase of bus operation, when the shift registers 156 are enabled by the DS output signal of state machine 151 and are selected by output signals 158 of decoder 154, PLD 28 of FIG. 2 can serially shift data into all shift registers 156 via the TDI line and can read data shifted out of these registers via the TDO line. The data stored in the latches and other devices 160 of FIG. 7 connected to the SC0–SC3 bus controls FPID operation.

The read/write control signal outputs of instruction decoder 154 may also select cross-point switch data shift register 88 or row select shift register 89 to receive data from the JTAG bus when input enabled by the DS signal during a data shift phase of the bus. Shift register 88 (also seen in FIG. 5) supplies the switch control data to the cross-point switch. The row select shift register 89 supplies the row address to row decoder 97, shown in FIG. 5.

Bi-directional Buffer

Figure 8:
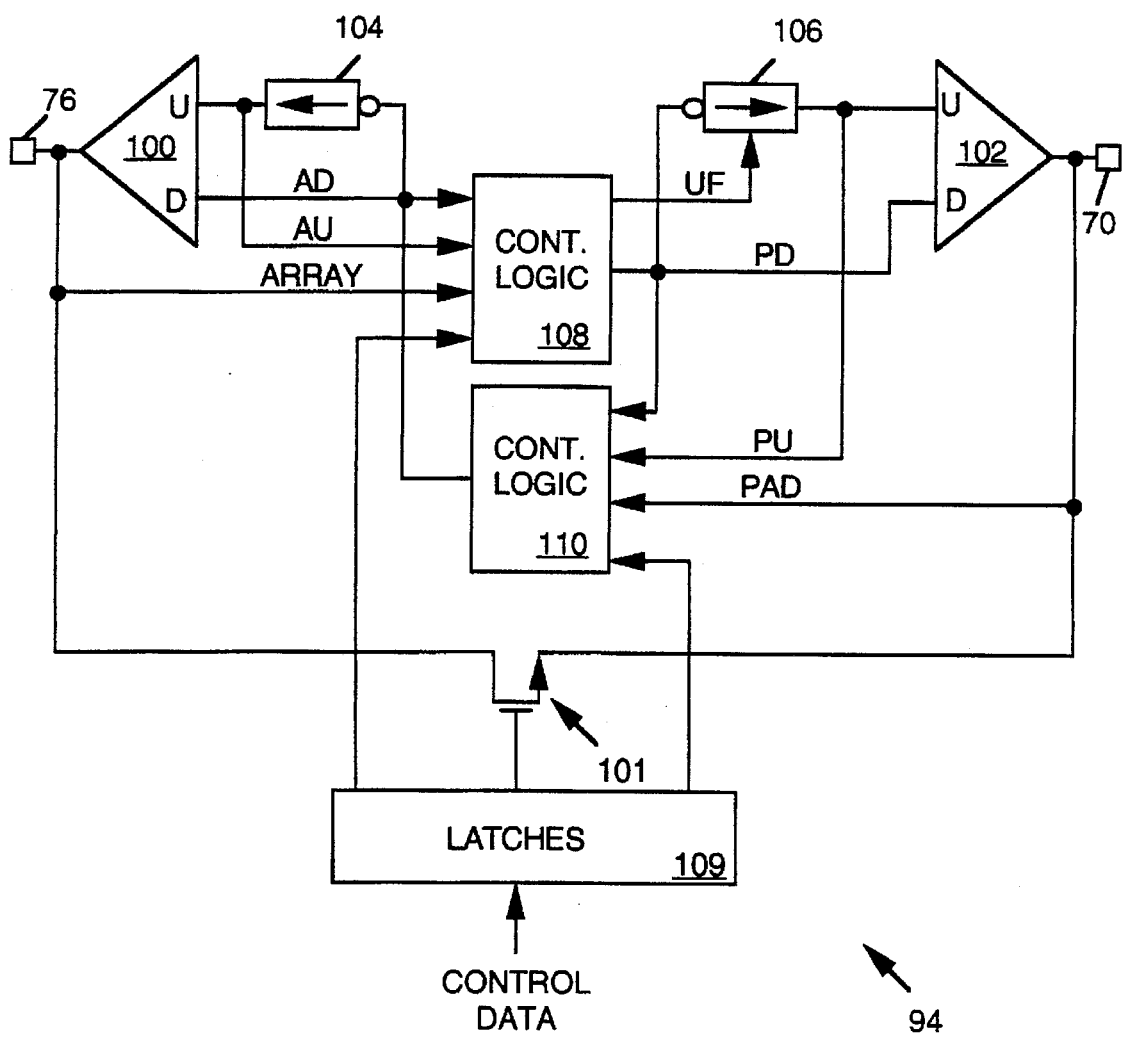
FIG. 8 illustrates in simplified block diagram form, the I/O buffer of FIG. 6.

FIG. 8 illustrates a typical bi-directional I/O buffer 94 of FIG. 6 in simplified block diagram form. I/O buffer 94 includes an output buffer 100 for driving the array port 76 and an output buffer 102 for driving the I/O port 70. The output AU of a single-shot device 104 controls a pull-up input U of buffer 100 while the output PU of another single-shot device 106 controls the pull-up input U of buffer 102. The output PD of a control logic circuit 108 drives the single-shot device 106 and the pull-down input D of buffer 102. Similarly, the output AD of another control logic circuit 110 drives the single-shot device 104 and the pull-down input D of buffer 100. The output of single-shot device 106 is forced high when a UF output of control logic circuit 108 is high. Inputs to control logic circuit 108 include AU, AD and the signal ARRAY on array port 76 from the cross-point switch array. Inputs to control logic circuit 110 include PU, PD and the signal PAD at I/O port 70, an external pin of the FPID.

A pass transistor 101 is connected between I/O ports 70 and 76. Pass transistor 101 acts as a switch and provides a direct, non-buffered, bi-directional path for analog signals passing between the two ports when pass transistor 101 is turned on.

The buffer 94 is controlled by input control data latched onto inputs of control logic circuits 108 and 110 by latches 109. Latches 109 also provide one bit of the control data to the base of pass transistor 101.

The I/O buffer 94 can operate in one of twelve different modes as follows:

No Buffer

In this mode pass transistor 101 is switched on by an NB signal from latches 109 so that signals pass between ports 70 and 76 via pass transistor 101 and are not buffered. The NB mode is particularly useful when the crosspoint switch 22 of FIG. 2 is to route analog signals which do not require buffering.

Unidirectional Input (UI)

In this mode the circuit passes data signals in one direction from I/O port 70 to cross-point array port 76. Logic circuit 108 and single-shot device 106 hold PD and PU low so that buffer 102 does not pull up or down on PAD. Logic circuit 110 drives AD low when PAD is high so that an AU pulse from single-shot device 104 causes buffer 100 to pull up ARRAY. Trickle charges in buffer 100 hold ARRAY up after the PU pulse goes away. LOGIC circuit 110 drives AD high when PAD is low so that buffer 100 pulls down ARRAY.

Unidirectional Inverted Input (UII)

In this mode the circuit inverts signals at I/O port 70 and passes them to cross-point array port 76. Logic circuit 108 and single-shot device 106 hold PD and PU low so that buffer 102 does not pull up or down on PAD. Logic circuit 110 drives AD low when PAD is low so that an AU pulse from single-shot device 104 causes buffer 100 to pull up ARRAY. Trickle charges in buffer 100 hold ARRAY up after the PU pulse goes away. LOGIC circuit 110 drives AD high when PAD is high so that buffer 100 pulls down ARRAY.

Unidirectional Output (UO)

In this mode the circuit passes data signals in one direction from cross-point array port 76 to I/O port 70. Logic circuit 110 and single-shot device 104 hold AU and AD low so that buffer 100 does not pull up or down on ARRAY. Logic circuit 108 drives PD low when ARRAY goes high. Single-shot device responds by pulsing PD causing buffer 102 to pull up PAD, and trickle charges in buffer 102 hold PAD up thereafter. Logic circuit 108 drives PU low when ARRAY is low so that buffer 100 pulls down PAD.

Bi-directional Buffer (BDR)

In this mode the circuit passes data signals in either direction between I/O port 70 and cross-point array port 76 depending on which signal ARRAY or PAD is externally driven. In this mode control logic circuits 108 and 110 act like three-input NOR gates. In the quiescent state, when neither port is externally driven, trickle charges in buffers 100 and 102 hold both PAD and ARRAY high. Control logic circuits 108 and 110 hold PD and AD low and single-shot devices 104 and 106 hold PU and AU low. When an external device pulls ARRAY low, control logic circuit 108 turns on PD thereby causing buffer 102 to pull down PAD. When the external device releases ARRAY, trickle charges in buffer 100 pull up on array and control logic circuit 108 responds by pulling PD down. The falling edge of PD causes single-shot device 106 to pulse PU high, thereby causing buffer 102 to quickly pull up PAD. Thereafter trickle charges in buffer 102 continue to hold PAD up. When an external device pulls PAD low, control logic circuit 110 pulls up AD thereby causing buffer 100 to pull down ARRAY. When the external device releases PAD, trickle charges in buffer 102 pull PAD back up. Control logic circuit 110 then pulls AD down, and the falling edge of AD causes single-shot device 104 to pulse AU high. Buffer 100 then briefly pulls up ARRAY. Thereafter trickle charges in buffer 100 continue to hold ARRAY up.

Tristate Unidirectional Input (TUI)

In this mode the circuit passes data signals in one direction from I/O port 70 to cross-point array port 76 when a tristate input signal TS to control logic circuit 110 is held high. Logic circuit 108 and single-shot device 106 always hold PD and PU low so that buffer 102 does not pull up or down on PAD. Logic circuit 110 and single-shot device 104 normally hold AD and AU low when TS is low. When TS and PAD are driven high, logic circuit 110 drives AD low. Single-shot device 104 responds by pulsing AU so that buffer 100 pulls up ARRAY. Trickle charges in buffer 100 hold ARRAY up thereafter. When TS is high and PAD is driven low, logic circuit 110 drives AU low so that buffer 100 pulls down ARRAY.

Tristate Unidirectional Inverted Input (TUII)

In this mode the circuit inverts data signals at I/O port 70 and passes them to cross-point array port 76, provided tristate input signal TS to control logic circuit 110 is held high. Logic circuit 108 always holds PU and PD low so that buffer 102 does not pull up or down on PAD. Logic circuit 110 normally holds AD and AU low when TS is low. When TS and PAD are driven high, logic circuit 110 drives AU low and AD high so that buffer 100 pulls down ARRAY. When TS is high and PAD is low, logic circuit 110 drives AU high and AD low so that buffer 100 pulls up ARRAY.

Tristate Unidirectional Output (TUO)

In this mode the circuit passes data signals in one direction from cross-point array port 76 to I/O port 70 when the tristate input signal TS to control logic circuit 108 is held low. Logic circuit 110 and single-shot device 104 always hold AD and AU low so that buffer 100 does not pull up or down on ARRAY. In the quiescent state, when TS is high, logic circuit 108 and single-shot device 106 hold PU and PD low so that buffer 102 does not control PAD. When TS is driven low and ARRAY is driven high, logic circuit 108 drives PD low. Single-shot device 106 pulses PU so that buffer 102 pulls up PAD. Trickle charges in buffer 102 hold up PAD thereafter. When TS is low and ARRAY is low, logic circuit 108 drives PD high so that buffer 102 pulls down PAD.

Tristate Bi-directional Buffer (TBDR)

In this mode the circuit passes data signals in either direction between I/O port 70 and cross-point array port 76 depending on which signal, ARRAY or PAD, is externally driven, provided the tristate input signal TS is high for input and low for output. In the quiescent state, when neither port is externally driven, trickle charges in buffers 100 and 102 hold PAD and ARRAY up. Control logic circuits 108 and 110 hold PD and AD low. Single-shot devices 104 and 106 hold PU and AU low. When an external device pulls ARRAY low in the presence of a low tristate control signal TS, control logic circuit 108 turns on PD thereby causing buffer 102 to pull down PAD. When the external device releases ARRAY, trickle charges in buffer 100 pull ARRAY back up. Control logic circuit 108 responds by pulling PD down. The falling edge of PD causes single-shot device 106 to pulse PU high, thereby causing buffer 102 to quickly pull up PAD. Thereafter trickle charges in buffer 102 continue to hold PAD up. When an external device pulls PAD low while TS is high, control logic circuit 110 pulls up AD, thereby causing buffer 100 to pull down ARRAY. When the external device releases PAD, trickle charges in buffer 102 pull PAD back up. Control logic circuit 110 then pulls AD down, and the falling edge of AD causes single-shot device 104 to pulse AU high. Buffer 100 then briefly pulls up ARRAY. Thereafter trickle charges in buffer 100 continue to hold ARRAY up.

Force Logic "1" Output (FL1O)

In this mode control logic circuit 108 holds PD low and holds UF high. The high UF signal drives up the PU output of single-shot device 106 which causes buffer 102 to pull up PAD.

Force Logic "0" Output (FL0O)

In this mode control logic circuit 108 holds PD high, thereby causing buffer 102 to pull down PAD regardless of the state of ARRAY.

No Connect (NC)

In this mode control logic circuit 108 drives PD low and control logic circuit 110 drives AD low so that the outputs of buffers 100 and 102 float.

In any mode where signals pass from array port 76 to I/O port 70, the I/O buffer 94 of FIG. 8 will delay signal transfer by 0, 20, 40 or 60 nanoseconds as determined by control data supplied control logic circuit 108. Logic circuit 108 delays change in state of its PD output signal accordingly.

Figure 9:
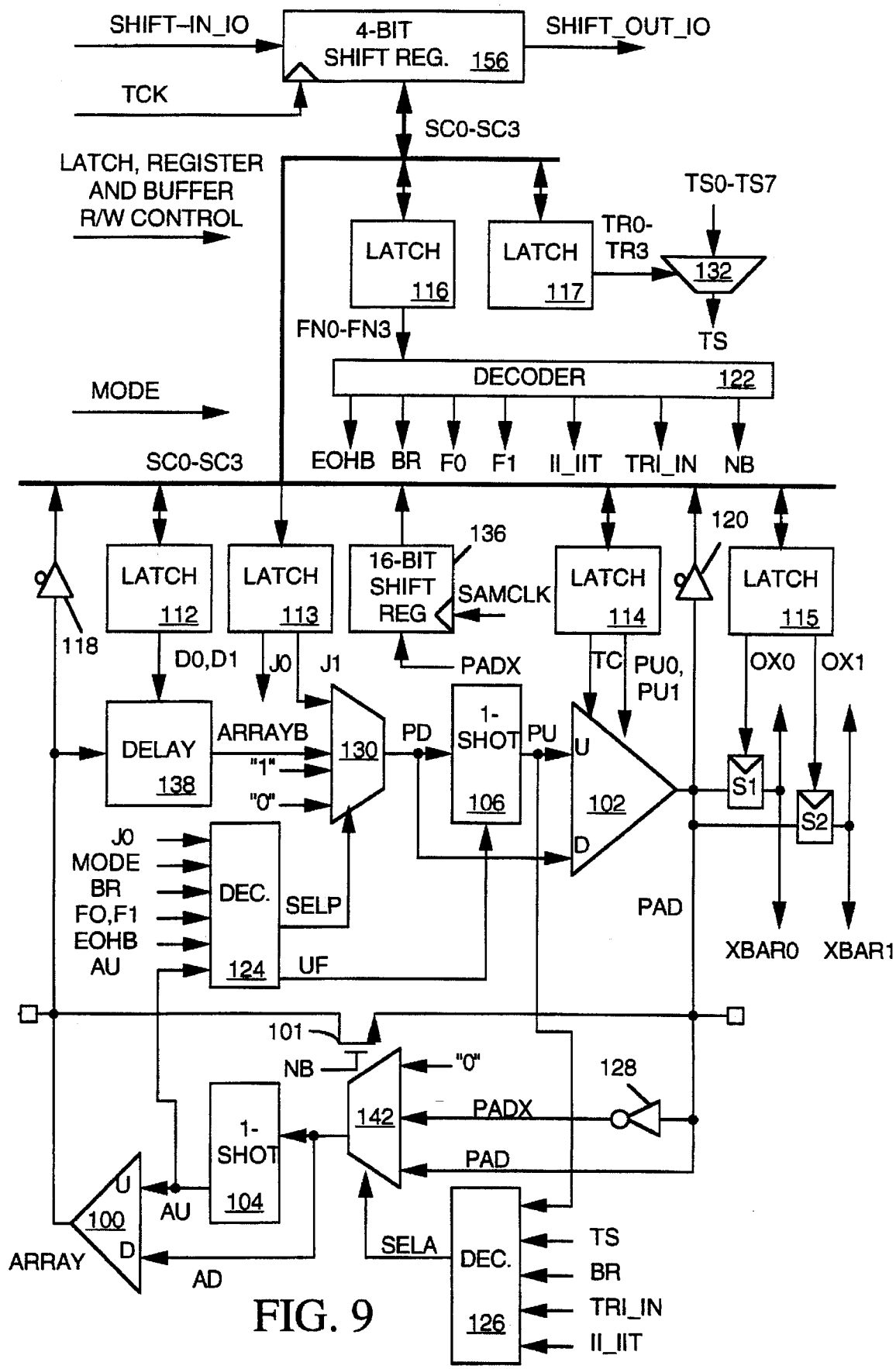
FIG. 9 depicts the I/O buffer of FIG. 6 in more detailed block diagram form.

FIG. 9 depicts an I/O buffer 94 of FIG. 6 in more detailed block diagram form to illustrate the contents of control logic blocks 108 and 110 and to illustrate additional features of the buffer not detailed in FIG. 8. The I/O buffer includes a 4-bit shift register 156 that shifts in a data signal SHIFT_IN_IO and shifts out a data signal SHIFT_OUT_IO. Shift registers of all I/O buffers are connected in series with the SHIFT_OUT_IO signal of one I/O buffer providing the SHIFT_IN_IO signal to the next of the series. The JTAG interface circuit 90 of FIG. 6 supplies the JTAG signal TDI as the SHIFT_IN_IO to the first buffer of the series, and connects the SHIFT_OUT_IO signal of the last buffer of the series to JTAG TDO line. The TCK JTAG signal clocks shift register 156 and a control signal from the JTAG controller input enables register 156.

PLD 28 of FIG. 2 may load control data into the shift registers 156 of all I/O buffers via the JTAG bus. One or more of the four data bits SC0–SC3 stored in shift register 156 are supplied as inputs to a set of latches 112–117, any one of which may be write enabled by the PLD via the JTAG interface. The following control data is supplied to latches in the I/O buffer via shift register 156:

D0,D1

These bits are stored in latch 112 and control the amount of signal delay passing through the buffer.

J0,J1

These bits are stored in latch 113 and are used to control the state of output buffer 102 when a MODE signal from the JTAG controller is asserted.

TC,PU0,PU1

These bits are stored in latch 114. The TC bit controls the maximum positive output swing (3 or 5 volts) of buffer 102 for compatibility with CMOS or L devices. The PU0 and PU1 bits switch output current sources (3, 17 or 20 mA) in buffer 102.

OX0,OX1

These bits are stored in latch 115 and control a pair of switches S1 and S2 for selectively connecting the PAD output of buffer 102 to the XBAR0 and XBAR1 outer crossbar transfer gates.

FN0–FN3

These bits are stored in latch 116 and select the operating mode of the buffer: unidirectional input, unidirectional inverted input, unidirectional output, bi-directional buffer, tristate unidirectional input, tristate unidirectional inverted input, tristate unidirectional output, tristate bi-directional buffer, force logic "1" output, force logic "0" output or no connect.

TR0–TR3

These bits stored in latch 117 control a multiplexer 132 that selects the particular one of eight lines TS0–TS7 to be employed as tristate control signal TS for the buffer.

Control logic circuit 108 of FIG. 8 is implemented by the combination of decoders 122 and 124, a multiplexer 130 and a variable delay circuit 138. The ARRAY signal delayed by a variable amount of time is supplied as an ARRAYB input to multiplexer 130. Delay circuit 138 delays the ARRAY signal by 0, 10, 20 or 30 nanoseconds depending of the state of the D0,D1 bits stored in latch 112. A logic "0", a logic "1" and the J1 bit stored in latch 113 are also supplied as inputs to multiplexer 130. The output of multiplexer 130 is PD signal supplied as input to single-shot device 106 and to the pull-down input of buffer 102. As discussed below, decoder 124 decodes several input signals from decoder 122 and elsewhere to produce an output signal SELP that controls the switching state of multiplexer 130. Decoder 124 also produces the UF signal that can force up the PD output of single-shot device 106.

Control logic circuit 110 of FIG. 8 is implemented by the combination of decoders 122 and 126, an inverter 128 and a multiplexer 142. The PAD signal is inverted by inverter 128 to produce a PADX signal. PADX and PAD are supplied as inputs to multiplexer 142 and a "0" logic level is tied to another input of multiplexer 142. Multiplexer 142 selects one of its inputs as the AD output applied to the pull-down D input of buffer 100 and to the input of single-shot device 104. As discussed below, decoder 126 decodes several input signals to produce a signal SELA that controls multiplexer 142.

Decoder 122 decodes the mode control bits FN0–FN3 from latch 116 and a MODE signal from the JTAG controller to produce the following signals used locally within the buffer:

NB

This signal, when active, turn on pass transistor 101 when the buffer is operating in the no buffer mode.

EOHB

This signal, when not active, tells decoder 124 to select the 0 logic level input to multiplexer 130. This causes PD and PU to remain low so that buffer 102 can neither pull up nor pull down PAD. When EOHB is active, decoder 124 can select an input to multiplexer 130 that may drive PD up. Decoder 122 asserts EOHB when the FN0–FN3 bits indicate the I/O buffer is in the unidirectional output mode, in the bi-directional buffer mode or in the tristate bi-directional buffer mode.

BR

This signal tells decoders 124 and 126 when the I/O buffer is to operate in one of the bi-directional buffer modes. When BR is asserted, decoder 124 switches multiplexer 130 to select the output of delay circuit 138 (unless inhibited by AU) and decoder 126 switches multiplexer 142 to select its PAD input (unless inhibited by PU).

TRI_IN

This signal tells decoder 126 that the I/O buffer is in one of the tristate modes. When TRI_IN is asserted, decoder 126 tells multiplexer 142 to select its "0" input unless the tristate control signal TS is asserted. When TS is asserted, decoder 126 tells multiplexer 142 to select the PAD input.

II_IIT

This signal is asserted when the I/O buffer is in one of the inverting modes and causes decoder 126 to switch multiplexer 142 to select its PADX input.

F0

This signal is asserted when the I/O buffer is in the force "0" logic output mode. It tells decoder 124 to select the logic "1" input to multiplexer 130, thereby driving up the PD input to buffer 102 and pulling down its output PAD.

F1

This signal is asserted when the I/O buffer is in the force "1" logic output mode. It tells decoder 124 to assert its UF output to force up the output PU of one shot device 106. This causes buffer 102 to drive PAD high.

The following is a truth table for decoder 124. An "X" indicates the signal is asserted, an "O" indicates the signal is not asserted and a "-" means signal state is not relevant.

TABLE I

| MODE OF OPERA- | INPUTS | | | | | OUTPUTS | |
|---|---|---|---|---|---|---|---|
| TION | F0 | F1 | BR | MODE | EOHB | SELP | UF |
| UI | O | O | O | O | O | "0" | O |
| UII | O | O | O | O | O | "0" | O |
| UO | O | O | O | O | X | ARRAYB | O |
| BDR | O | O | X | O | X | ARRAYB* | O |
| TUI | O | O | O | O | O | "0" | O |
| TII | O | O | O | O | O | "0" | O |
| TUO | O | O | O | O | X | ARRAYB | O |
| TBDR | O | O | X | O | X | ARRAYB* | O |
| FL1O | O | X | — | O | — | "0" | X |
| FL0O | X | O | — | O | — | "1" | O |
| NC or NB | O | O | X | O | O | "0" | O |
| ANY MODE | — | — | — | X | — | J1 | J0 |

*AU when asserted requires SELP selection of "0" in the bi-directional buffer modes.

The following is a truth table for decoder 126. An "X" indicates the signal is asserted, an "O" indicates the signal is not asserted and a "-" means signal state is not relevant.

TABLE II

| MODE OF OPERA- | INPUTS | | | | OUTPUT |
|---|---|---|---|---|---|
| TION | TS | BR | TRI_IN | II_II | SELB |
| UI | — | O | — | O | PADX |
| UII | — | O | O | X | INVERSE PADX |
| UO | O | X | X | — | "0" |
| BDR | — | X | O | — | PADX* |
| TUI | X | O | X | O | PADX |
| TII | X | O | X | X | INVERSE PADX |
| TUO | O | X | X | — | "0" |
| TBDR | X | X | X | — | PADX* |
| FL1O | O | X | X | — | "0" |
| FL0O | X | X | X | — | "0" |
| NC or NB | O | X | X | — | "0" |

*PD when asserted requires "0" as SELB output in the bi-directional buffer modes.

The following is a truth table for decoder 122. An "X" indicates the signal is asserted, an "O" indicates the signal is not asserted.

TABLE III

| INPUT | OUTPUTS | | | | | | |
|---|---|---|---|---|---|---|---|
| FN0–FN3 | EOHB | BR | F0 | F1 | II_IIT | TRI_IN | NB |
| UI | O | O | O | O | O | O | O |
| UII | O | O | O | O | X | O | O |
| UO | X | O | O | O | O | O | O |
| BDR | X | X | O | O | O | O | O |
| TUI | O | O | O | O | O | O | O |
| TII | O | O | O | O | X | X | O |
| TUO | X | O | O | O | O | O | O |
| TBDR | X | X | O | O | O | O | O |
| FL1O | O | O | O | X | O | O | O |
| FL0O | O | O | X | O | O | O | O |
| NC | O | X | O | O | O | O | O |
| NB | O | X | O | O | O | O | 1 |

Hierarchical Field Programmable Interconnect Device

FIG. 10 is a block diagram of the hierarchical field programmable interconnect device (FPID) 48 of FIG. 4A. In the preferred embodiment, FPID 48 interconnects selected pairs of 320 input/output (I/O) lines IO0–IO319 to provide bi-directional signal paths therebetween. However in alternative embodiments FPID 48 may handle a larger or smaller number of I/O lines. FPID 48 includes a set of buffers 214 for buffering signals between the I/O lines and a corresponding set of ports P0–P319 of a folded, hierarchical, crosspoint switch array 216. Buffers 214 are similar to I/O buffers 94 of FIG. 5 and are not further detailed herein below. In the backplane system of FIG. 4A, lines IO0–IO295 correspond to microstrip conductors 61 while lines IO296–319 correspond to bus 60. Ports P296–P319 implement bus 62 of FIG. 4A.

Crosspoint switch array 216 selectively routes bi-directional signals between pairs of ports P0–P319. Array 216 comprises an array of switching cells, one cell corresponding to each possible pair of ports P0–P319. Each switching cell of array 216 includes a single bit memory cell and a pass transistor switch. When the switch is closed, the corresponding pair of ports P0–P319 are interconnected and signals may pass bi-directionally therebetween. The state of a bit stored in the memory cell within each switching cell determines whether the switch is closed. The switch memory cells are arranged to form a 320×320 static random access memory (SRAM). A separate one of 320 word lines W0–W319 is supplied to each of 320 rows of memory cells and a separate one of 320 bit lines B0–B319 is supplied to each of 320 columns of memory cells within array 216.

Each bit "line" actually requires two conductors and conveys a differential signal indicating a state of a bit to be stored in the array. When one of word lines W0–W319 is asserted, one row of memory cells is selected and data bits appearing on separate ones of the 320 bit lines are written into the separate memory cells of the selected row. Thus the switching state of array 216, the signal routing connections that it makes between ports P0–P319, may be established using 320 memory write operations, where each write operation writes a 320 bit word appearing on bit lines B0–B319 to a separate one of the 320 rows of memory cells in array 216.

Normal Mode Operation

In a "normal" mode of operation, data for controlling operation of FPID 48 is transferred in serial fashion from an external controller such PLD 46 of FIG. 4A via the JTAG bus 218. This is the mode in which PLD 46 of FIG. 4A initially programs FPID 48 upon system startup. A JTAG interface circuit 220, generally similar to the interface circuit of FIG. 7, receives and executes incoming instructions from PLD 46 of FIG. 4A on JTAG bus 218. These instructions tell the JTAG interface circuit 220 to store data conveyed on the JTAG bus 218 in various registers and latches within FPID 48. Some of these instructions tell the JTAG interface circuit 220 to store data in registers within buffers 214. This data selects one of the various operating modes of each buffer 214, including for example whether a buffer 214 level shifts, blocks or inverts its input. Other instructions received on the JTAG bus 218 also convey data for programming array 216.

To write a 320-bit data word into array 216, PLD 46 of FIG. 4A serially transmits a 320 bit word BIT STRING to interface circuit 220 via bus 218 along with control and address bits telling the JTAG I/F circuit 220 to serially shift BIT STRING into a shift register 222. The PLD 46 next uses the JTAG bus 218 to serially transmit a 9-bit word address I0–I8 to interface circuit 220 along with control and address bit telling circuit 220 to load that word into another shift register 224. In the normal mode of operation, a write controller circuit 226 passes the data in register 224 as a 9-bit word address (WORD ADDR) to a word decoder 228. PLD 46 then sends an instruction to interface circuit 220 telling it to store a logically true WE (write enable) bit in a register 230. The WE bit in register 230 is supplied to shift register 222. Finally, PLD 46 sends an instruction to JTAG interface circuit 220 telling it to transmit a RAMSEL signal to write controller 226.

Controller 226 responds to the RAMSEL signal by asserting an output SELECT signal supplied to word decoder 228. Decoder 228 responds to the SELECT signal by decoding the 9-bit WORD ADDR to determine which of the word lines W0–W319 is being addressed. Controller 226 then pulses a precharge signal (PCHG) telling word decoder 228 to assert the addressed word line. The PCHG signal also tells shift register 222 to latch its stored 320-bit data onto the bit lines B0–B319 when the shift register 222 is output enabled by the WE signal. When controller 226 thereafter deasserts the SELECT signal, the 320-bit data appearing on the BIT LINES are stored in the particular row of memory cells accessed by the selected one of word lines W0–W319.

Rapid Connect Mode Operation

FPID 48 may operate in an alternative "rapid connect" mode. The rapid connect mode permits a instruction source 56 of FIG. 4A to access FPID 48 via parallel bus 60 and to write a bit into a single memory cell of array 216 in a single cycle of that parallel bus. If the backplane of FIG. 4A is to make use of this feature, then the last bits of data transmitted by PLD 46 to interface circuit 220 during initial programming must direct FPID 48 to operate thereafter in the rapid connect mode. Before switching FPID 48 to the rapid connect mode, PLD 46 should load data into all memory cells within switch array 216 using the normal mode of operation. Since the rapid connect mode makes use of ports P296–P319 for conveying programming information, these ports should not not be used for other purposes when the FPID is to operate in the rapid connect mode. Thus switch array 216 should not be programmed to connect any of ports P296–P319 to any other ports when the rapid connect mode is in use.

Ports P296–P319, accessed via I/O lines IO296–IO319 and buffers 214, forms the 24-bit parallel bus 62 for conveying an instruction to write controller 226 from an instruction source 56 of FIG. 4A. Table IV lists the information conveyed by that 24-bit instruction:

TABLE IV

| BITS | PURPOSE |
| --- | --- |
| P296–P304 | Word address |
| P305 | Unused |
| P306–P314 | Bit address |
| P315 | Unused |
| P316–317 | Operation code |
| P318 | Write Enable |
| P319 | Strobe |

The word (line) address (P296–P304) is a 10-bit value, with the tenth bit reserved for future use, indicating the word line for write enabling a memory cell of interest. Bit P305 is unused. The bit (line) address (P306–P314) is a 10-bit value, with the tenth bit reserved for future use, indicating a particular bit line (B0–B320) leading to the memory cell of interest. Bit P315 is unused. The operation code (P316–P317) is a 2-bit value indicating a particular action to be taken. The four possible actions are listed below in Table V.

TABLE V

| P316 | P317 | Action |
|------|------|--------|
| 0 | 0 | Write "0" to cell of interest and to all cells of row of interest |
| 0 | 1 | Write "1" to cell of interest and "0" to all other cells of row of interest |
| 1 | 0 | Write "0" to cell of interest, leave contents of all other cells unchanged |
| 1 | 1 | Write "1" to cell of interest, leave contents of all other cells unchanged |

The write enable signal (P318) is held low to enable the operation code to be written into controller 226 of FIG. 10. The strobe signal (P319) is asserted to initiate a memory write operation when the word and bit address and the operation code are delivered to controller 226.

While FPID 48 is in the normal mode of operation a QWE bit of logic state "0" is stored in register 232. To enter the rapid connect mode, PLD 46 loads a logical "1" QWE bit into register 232 via interface circuit 220. Thereafter to change the state a bit stored in a single memory cell of interest within array 216, an instruction source 56 of FIG. 4A pulls the write enable line P318 low and then transmits a parallel data word to controller 226 including a word address via ports P296–P304, a bit address to controller 226 via ports P306–P314, and an appropriate operation code via ports P316–P317. The instruction source then pulses a strobe input of controller 226 via port P319, thereby to initiate a memory write operation. The instruction source releases bus 60 by releasing write enable line P318.

Controller 226 responds to the pulse at its strobe input by forwarding the 9-bit word address to word decoder 228 and the 9-bit bit address to a bit decoder 234. The controller 226 then asserts (pulls low) the SELECT signal to write the word address into word decoder 228. Thereafter controller 226 transmits a 3-bit WRITE strobe signal to bit decoder 234. Bit decoder 234 controls the bit lines B0–B319 of switch array 216. The WRITE strobe signals indicate whether bit decoder 234 is to set the bit line leading to the memory cell of interest to a logical "1" or a logical "0". The WRITE strobe signals also indicate whether the bit decoder 234 is to drive the remaining 319 bit lines to a logical "0" or let them float. Controller 226 then pulses the PCHG signal transmitted to word decoder 228 and bit decoder 234 telling them to decode the word and bit addresses. The word decoder 228 asserts a particular one of word lines W0–W319 thereby to write enable a selected row of memory cells for receiving data appearing on the bit lines. Bit decoder 234 drives high or low the particular one of bit lines B0–319 leading to the memory cell column of interest, thereby to set the bit stored in the cell of interest to a logical "1" or "0" as indicated by the WRITE strobe signals. Also, depending on the operation requested by the WRITE strobe signals, bit decoder 234 may also either pull low all other bit lines or let them float. If these bit lines float, the data bit values previously stored in all memory cells of the row of interest (other than the cell of interest) remain unchanged. If the WRITE strobe signal tells the bit decoder 234 to pull the other bit lines low, then the bits stored in all these other memory cells of the row of interest are set to logical "0". Thereafter, when controller 226 deasserts the SELECT signal, the rapid connect operation is complete.

Thus the rapid connect operation requires only a single cycle of the parallel "bus" formed by ports P296–P319 and allows an instruction source 56 of FIG. 4A to take one of two actions. It can set a bit of any particular memory cell of any particular row of array 216 to a "1" or a "0" while leaving the states of bits in all other memory cells unchanged. The instruction source 56 can also set the bit of the particular memory cell in array 216 to a "1" or a "0" while setting the bits in all other memory cells of the particular row to 0. This means that the instruction source 56 can, in a single cycle of parallel bus 60, make or break any individual connection between the remaining ports P0–P295 and can, if desired, break all connections between ports P0–P295 formed by cells of the particular array row.

Write Controller

Figure 11:
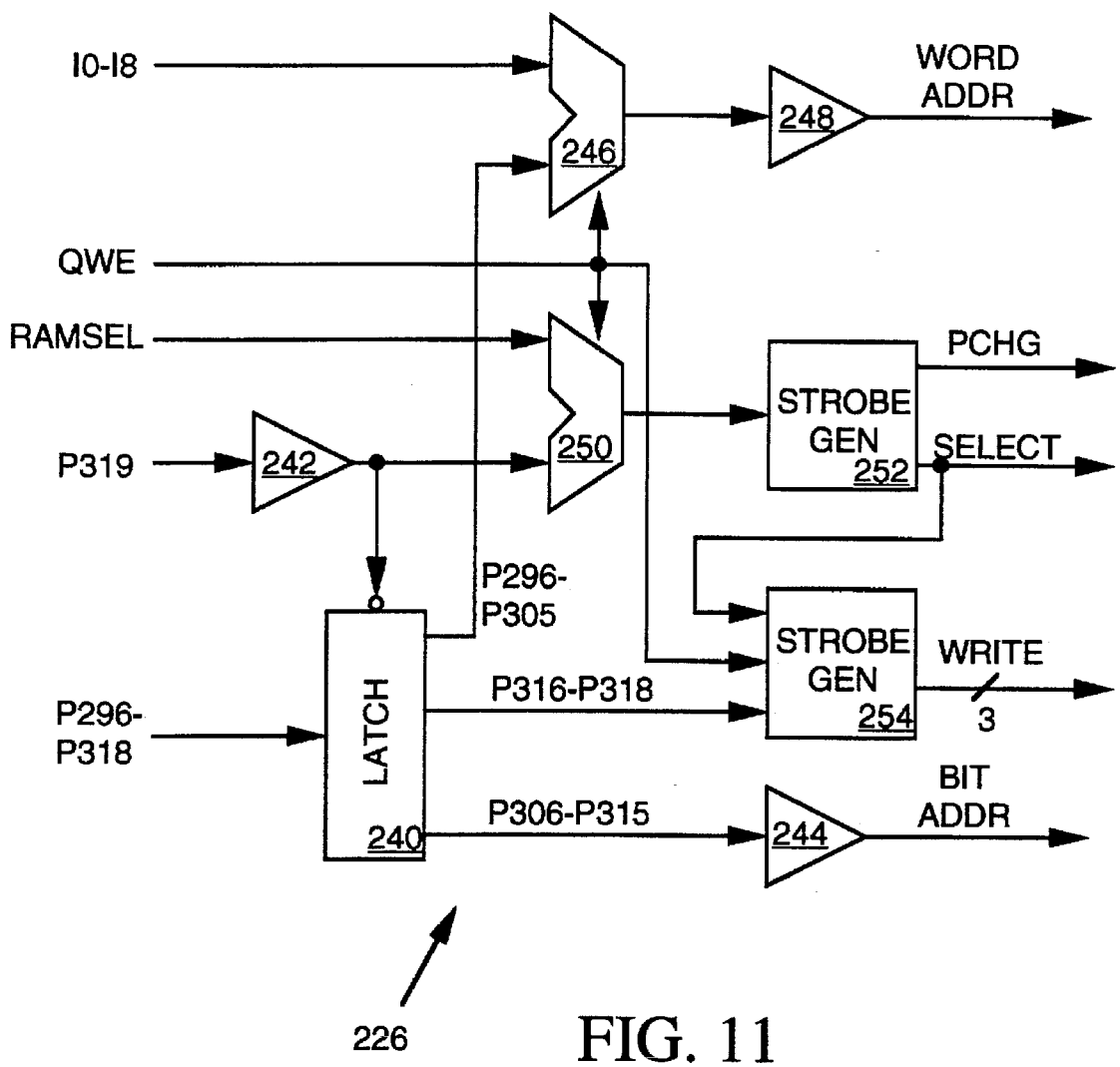
FIG. 11 illustrates in block diagram form the write controller of FIG. 10.

FIG. 11 illustrates write controller 226 of FIG. 10 in more detailed block diagram form. The word and bit address, the operation code and enable bits on parallel bus lines P296–P318 arrive at a latch 240 operated by the strobe signal on bus line P319 via a buffer 242. The bit address on P306–P315 is latched onto the input of another buffer 244, the output of which is delivered to bit decoder 234 of FIG. 10. The word address arriving via ports P296–P304 is latched onto the input of a multiplexer 246 while the word address I0–I8 provided by shift register 224 of FIG. 10 is supplied to a second input of multiplexer 246. The QWE signal from register 232 of FIG. 10 controls multiplexer 246 and selects one of the word addresses appearing on I0–I8 or P296–P305 for transmission to a buffer 248 depending on whether the FPID is operating in the normal or rapid connect mode. Buffer 248 forwards the selected word address to word decoder 228 of FIG. 10. A second multiplexer 250, also controlled by the QWE signal, selects the RAMSEL signal from JTAG interface circuit 220 of FIG. 10 and forwards it to a strobe signal generator 252 when the FPID is operating in the normal mode. In the rapid connect mode, multiplexer 250 selects the P319 signal output of buffer 242 and forwards it to strobe generator 252. On receipt of the RAMSEL or P319 signal, strobe generator 252 generates the SELECT signal transmitted to word decoder 228 of FIG. 10 and the PCHG signal transmitted to shift register 222, word decoder 228 and bit decoder 234 of FIG. 10.

The SELECT signal output of strobe generator 252 also provides an input to another strobe generator 254 which produces the three WRITE strobe signals supplied to bit decoder 234 of FIG. 10. Strobe generator 254 operates only in the rapid connect mode and is disabled by the QWE signal when the FPID is operating in the normal mode. In the rapid connect mode, strobe generator 254 generates the WRITE strobe signals in accordance with the operation selected by the P316–P317 operation code output of latch 240, provided write enable bit P318 is held low.

Folded Hierarchical Switch Array

Switch array 216 of FIG. 10 includes a set of switch cells, each of which includes a pass transistor for interconnecting a pair of ports P0–P319 when enabled, and a single bit memory for storing a bit controlling the switch. Array 216 is a type of "triangular" array insofar as it is able to interconnect any two ports P0–P319 using only a single switch cell. As described below, the layout of array 216 on an integrated circuit is "folded" in a way that requires less integrated circuit surface area than a conventional triangular crosspoint array. Also, as described herein below, array 216 is "hierarchical" in that switch cells therein are organized into a hierarchy of subarrays, with a control cell provided for each subarray. A data bit stored in each control cell indicates whether all switching cells of an associated subarray are enabled to respond to the bits they store in their memories. The control cells provide multiple levels of control over array 216 whereby large blocks of switch cells can be controlled by altering data in only a few control cells while the FPID is in the rapid connect mode. When the FPID is used to provide a programmable backplane as in FIG. 4A, each subarray can be initially programmed to implement a different signal routing pattern. Each routing pattern can be selectively inhibited or enabled by instruction sources 56 simply by sending an instruction to the FPID altering the contents of a single control cell.

FIG. 12A illustrates a prior art 8-port triangular crosspoint switch array. Each of a set of switch cells S are arranged into a triangular array selectively. Each cell S includes a switch for interconnecting a pair of ports P0–P7 and a single bit memory for storing a bit controlling the state of the switch. Each cell appears at the intersection of one of word lines W0–W7 and one of bit lines B0–B7. The bit may be written into any cell S by placing the bit on the bit line leading to the cell and strobing the word line leading to the cell. The triangular array of FIG. 12A can connect any port to any other port through only a single pass transistor, but it makes inefficient use of integrated circuit space.

FIG. 12B is a block diagram of a typical prior art switch cell S of FIG. 12A. A switch 256 interconnecting ports X and Y is controlled by a bit stored in a memory cell 258. The bit is delivered to cell 258 via a bit line and written into memory 258 in response to a pulse on the word line.

FIG. 12C is a schematic diagram of a typical prior art switch cell S of FIG. 12A comprising transistors M1–M7. The "bit" is delivered to the cell via a differential signal, and therefore the bit "line" actually requires two conductors BM and BP. The word line W controls transistors M6 and M7. If BM is driven low and BP is driven high when the word line W is pulsed, M1 and M4 turn off and M2 and M3 turn on, thereby turning M5 on to provide a signal path between X and Y. If BM is driven high and BP is driven low when the word line W is pulsed, M1 and M4 turn on and M2 and M3 turn off, thereby turning M5 off to break the signal path between X and Y. If BM and BP are allowed to float while the word line W is pulsed, the switching states of M1–M5 remain unchanged.

FIGS. 13A and 13B, when superimposed, form a block diagram illustrating an integrated circuit layout of a "folded, hierarchical, triangular" crosspoint array 260. Array 260 is a building block for the crosspoint array 216 of FIG. 10. Array 260 uses the same number (28) of switch elements as the triangular crosspoint array of FIG. 12 and provides the same routing capability of the prior art triangular crosspoint array insofar as it can connect any port P0–P7 to any other port P0–P7 through a pass transistor in only a single switch element L1. However the folded triangular crosspoint array 260 is arranged differently so that it is more compact and consumes less space in an integrated circuit chip. Also the switch elements L1 of array 260 differ from switch elements S of array of FIG. 12 in a way that makes array 260 suitable for use as a building block for a "hierarchical" crosspoint array. As discussed herein below, a hierarchical crosspoint array can more rapidly change interconnections between buses than a conventional triangular crosspoint array.

Array 260 of FIGS. 13A and 13B includes two sets of four "horizontal" I/O lines 266 and 268 and one set of eight "vertical" I/O lines 261. Pairs of I/O lines 267 and 268 are interconnected at nodes 267 where they intersect along a main diagonal. A set of bit lines B0–B7 enter the right side of array 260, turn 90 degrees near the main diagonal and then depart at the top of array 260. A set of four word lines W0, W1, W2, and W3 enter at the left of array 260 while a second set of four word lines W4, W5, W6, and W7 enter at the bottom of array 260. Crosspoint array 260 is made up of four basic types of cells 262–265. Switch connections between horizontal and vertical I/O lines are provided by "Level 1" switching cells L1 included in cell types 262 and 263.

Like the switching cells S of FIG. 12A, the level one cells L1 of FIGS. 13A and 13B make or break connections between pairs of ports in response to data bits stored therein. Also the data bits are loaded into the memories of the switching cells L1 using the bit and word lines in the same fashion as the cells S of the triangular array of FIG. 12. However, the L1 cells have an additional control input CONT2. That CONT2 control input operates as a "second level" of control over the switching operation of the L1 cells, the data bit stored in each L1 cell providing the first level of control. When the CONT2 is high, the L1 cells make or break connections between their respective port pairs according to the the state of their stored bits. However when the CONT2 cell is low, the each L1 cell breaks its port connection regardless of the state of the bit stored in its memory. Since CONT2 signal is supplied in parallel to all L1 cells of array 260, an external controller driving CONT2 can quickly break all connections of the array without having to alter the data stored in any of the 28 L1 cells.

FIG. 13C illustrates how the various cell types 262–265 are arranged on an integrated circuit. Cell type numbers marked with an asterisk (*) are turned 90 degrees clockwise and are mirror images of similarly numbered cells not marked with an asterisk (*). As formed in a common plane in an integrated circuit, cells 262–265 are all rectangular with substantially a 2/1 aspect ratio, each cell having two opposing sides that are substantially twice as long as their adjacent sides. However the crosspoint array 260 that they form covers a substantially square area in the common plane of the integrated circuit.

FIG. 14 symbolically depicts the folded, triangular crosspoint array 260 of FIGS. 13A and 13B. This symbol L2T is used herein when illustrating array 260 as a subarray building block for a larger crosspoint array. In FIG. 14, the symbol for array 260 is labeled "L2T" for "Level 2 Triangular". The "B's" and "W's" along the cell sides indicate where bit and word lines enter/depart the array.

FIG. 15 illustrates a level 1 cell type 262. This cell includes three I/O lines 266, 267 and 268 for carrying signals between ports. I/O lines 266 and 268 extend across the cell in its narrower dimension while I/O line 267 extends across the cell in its wider dimension, orthogonal to I/O lines 266 and 268. Cell 262 also includes a bit line 270 extending across the cell in parallel with I/O line 267 and a word line 275 extending across the cell in parallel with I/O lines 266 and 268. Bit line 270 is actually two conductors since it conveys a differential signal. Control line CONT2 crosses the cell in parallel with I/O line 267.

Cell 262 includes a switch 274 to selectively interconnect orthogonally disposed I/O lines 266 and 267 and a memory 276 to store a single control bit conveyed on bit line 270 in response to a pulse on word line 275. Switch 274 is suitably a pass transistor having signal terminals connected between lines 266 and 267 and having a control terminal driven by the CONT1 signal. Cell 262 includes a logic circuit 278 interposed between memory 276 and switch 274. Logic circuit 278, suitably an AND gate, receives the output signal 280 produced by memory 276 indicating the state of its stored bit. Logic circuit 278 also receives the externally generated control signal CONT2 and generates a logic signal CONT1 for controlling the operation of switch 274. When signal 280 indicates that the bit stored in memory 266 is true and control signal CONT2 conveys a true bit, logic circuit 278 signals switch 274 to create a signal path between I/O lines 266 and 267. However if the bit in memory 266 is false or if the bit conveyed by control signal CONT2 is false, logic circuit 278 signals switch 274 to break the signal path between I/O lines 266 and 267. Schematically cell 262 is similar to cell S of FIG. 12A except that additional pass gates controlled by CONT2 are inserted between M5 and M2 and between M1 and M5 of FIG. 12C to implement logic circuit 278. Please see detailed schematic of cell 262.

FIG. 16 illustrates a level one cell type 263. This cell also includes three I/O lines 266, 267 and 268 for carrying signals between ports. Port lines 266 and 268 extend across the cell in its narrow dimension while I/O line 267 extends across the cell in its wider dimension, orthogonal to I/O lines 266 and 268. I/O lines 267 and 268 are permanently interconnected where they intersect at node 261. Cell 263 includes a bit line 270 providing data input to memory 276. Bit line 270 enters the right side of the cell, turns 90 degrees and then extends to the top of the cell. A word line 275 enters on the left side of the cell and terminates at memory 276. Control line CONT2 crosses the cell in parallel with I/O line 267 and also provides input to logic circuit 278. The memory, logic and switch circuits of FIG. 16 operate in a manner similar to those of FIG. 15 so as to provide selective control over interconnections between I/O lines 266 and 267.

FIG. 17 is a block diagram depicting a 4×8 rectangular crosspoint array 290. Array 290 is used with the folded triangular array of FIGS. 13A and 13B as building block subarrays for constructing a larger crosspoint array. Array 260 is a 4×8 array of switching cells 262 of the type illustrated in FIG. 15.

FIG. 18 symbolically depicts the folded rectangular crosspoint array 290 of FIGS. 17. In FIG. 18, the symbol for array 290 is labeled "L2R" for "Level 2 Rectangular" and also marked with "B's" and "W's" on the cell sides where bit lines ("B") and word lines ("W") enter and depart the cell.

FIG. 19A is a block diagram of the integrated circuit layout of a three-level, hierarchical crosspoint array 300. Crosspoint array 300 may be used as a 32 port crosspoint switch. The three-level crosspoint array 300 includes a 4×4 array of Level 2 cells, where each Level 2 cell is either a triangular crosspoint array L2T similar to that shown in FIGS. 4A and 4B or a rectangular crosspoint array L2R similar to that shown in FIG. 17. The Level 2 triangular cells A–D are positioned along the main diagonal of the array while the Level 2 rectangular cells E though J and E* though J* comprise the remaining Level 2 cells of array 300. For simplicity, FIG. 19A shows only two of the eight I/O lines entering/leaving each edge of each Level 2 cell and shows none of the word and bit lines. The routing of bit and word lines though the array is indicated by the "W" and "B" labels on the edges of the Level 2 cell symbols. The I/O lines follow paths adjacent to the word lines. Note that the rectangular cells E*–J* are rotated 90 degrees from their "complement" rectangular cells E–J. Their corresponding control cells will also be addressed by the same word and bit lines.

In addition to the Level 2 switching cells of the type L2T and L2R, crosspoint switch 300 also includes a set of Level 2 control cells L2. Each of these Level 2 control cells L2 produces a separate Level 2 control signal CONT2 in response to an input Level 3 control signal CONT3 and a data bit stored in the control cell L2. The CONT2 signal from each control cell L2 is supplied in parallel to every first level switching cell within a corresponding second level switching cell L2R or L2T.

Referring again to FIGS. 15 and 16 illustrating individual first level switching cells, the CONT2 signal is supplied to logic circuit 278. When that signal is false, logic circuit 278 inhibits switch 274 from interconnecting I/O lines 266 and 267 even when the bit in memory 276 otherwise indicates the switch should connect the I/O lines.

Referring back to FIG. 19A, when bits in all Level 2 control cells L2 are true, crosspoint array 300 acts like a conventional 32 port triangular crosspoint array insofar as it can selectively interconnect any two of its 32 ports through only a single switch cell. The connections are controlled entirely by the data stored within the individual Level 1 switching cells within each Level 2 crosspoint array L2T or L2R and their compliments. However by selectively setting data bits stored in second level control cells L2 false, the I/O line interconnection activity of entire second level subarrays L2T or L2R and their compliments can be inhibited regardless of the data stored in the memories of their first level switching cells L1. Thus while the data stored in the memory of an individual first level switching cell L1 within each subarray L2R or L2T and their compliments can determine whether or not two individual ports are interconnected, the data bit stored in a second level control cell L2 may be used to concurrently control switch operation of all first level cells within a corresponding second level array L2T or L2R and their compliments. Level 2 control cells L2 thus provide a second level of control over switching activity of the hierarchical crosspoint array 300.

The crosspoint array 300 of FIG. 19A is particularly suited to rapidly switching connections between a set of eight-bit buses. For example as illustrated in FIG. 19B, assume an eight bit computer bus BUSW is connected to ports P0–P7 along the bottom of array 300 and eight bit buses BUSX, BUSY and BUSZ from three different peripheral devices were connected to ports P8–P15, P16–P23, and P24–P31, respectively, along the three remaining sides of array 300. Assume BUSW is initially connected to BUSZ through Level 1 cells within Level 2 subarrays H and H*. We could switch BUSZ from BUSW to BUSX by first changing the data stored in the memories of Level 1 switching cells within subarrays H and H* to disconnect BUSW from BUSZ. We could then change data in the Level 1 cells within Level 2 subarrays F and F* to connect BUSX to BUSZ. However changing data in so many Level 1 switching cells would require much time, particularly when this control data must pass through a serial JTAG bus on the way to the crosspoint array.

On the other hand, suppose first level memories within second level subarrays H and H* were initially programmed to connect BUSW to BUSZ and memories of Level 1 switching cells within Level 2 subarrays F and F* were initially programmed to connect BUSX to BUSW. If data stored in Level 2 control cells L2 initially inhibited switching activity of all second level subarrays except subarrays H and H*, BUSW would initially be connected to BUSZ. Even though the other Level 2 subarrays are programmed to connect BUSW to BUSX and BUSY, false data bits in the second level control cells L2 inhibits them from actually doing so. To switch BUSW from BUSZ to BUSX, we need only change the four data bits stored in the Level 2 control cells L2 which control the four second level subarrays H, H*, F and F*. We can thereafter switch BUSW from BUSZ to BUSX or back to BUSZ with the same speed simply by changing the data stored in only a relatively few second level control cells L2.

Note that since subarrays and their complements (e.g. H and H*) are always switched simultaneously, we can assign their control cells the same word/bit address, thereby further reducing switching time. Thus the hierarchical crosspoint array 300 of FIG. 19 can be used to rapidly switch buses by first storing data indicating the various bus switching patterns in the Level 1 switching cells and then using the Level 2 control cells to select from among those predetermined patterns.

FIG. 19C is a block diagram illustrating a typical second level control cell L2 of FIG. 19A. Cell L2 includes a single bit memory 304 and a logic circuit 302, suitably an AND gate. Memory 304 stores a bit on a bit line 306 in response to a pulse on word line 308 and produces an output signal 309 indicating the state of the stored bit. Logic circuit 302 receives output signal 309 and also receives an externally generated control signal CONT3. If the bit stored in memory 304 is true, and if the CONT3 signal is true, logic circuit 302 produces an output CONT2 signal of true state. If the bit stored in memory 304 is false or if the CONT3 signal is false, then logic circuit 302 sets CONT2 false.

Referring again to FIG. 19A, the CONT3 signal is an externally generated signal that is supplied in parallel to every level 2 control cell L2. Thus if the CONT3 signal is false, all of the second level cells of array 300 are inhibited from interconnecting ports P0–P31. Thus the Level 3 switching array 300 of FIG. 19A has three levels of switching control. The first level of control is provided by the data stored in the memories of the first level (L1) switching cells within each second level array L2R or L2T. The second level of control is provided by the data stored in the memories of the Level 2 control cells L2. If the CONT2 signal produced by a Level 2 control cell L2 is false, then the associated level 2 switching cell makes no interconnections regardless of the state of control bits stored in Level 1 switching cells L1 therein. The third level of control is provided by the externally generated CONT3 signal. If that signal is false, the entire array 300 is inhibited from interconnecting any of the ports P0–P31 regardless of the state of data in the Level 1 and Level 2 switch and control cells.

The three-level array 300 can be used as a building block subarray in a higher level folded crosspoint array. FIG. 20 is a symbol L3T for depicting the level three triangular crosspoint array 300 FIG. 19A when illustrating its use in a higher level array.

FIG. 21 is a block diagram illustrating routing of selected word and bit lines through the second level control cells L2 of the crosspoint array 300 of FIG. 19A. For simplicity, the I/O lines, word lines, control lines and most of the bit lines for the Level 1 switch cells of L2R and L2T are not shown. The second level control cells L2 require only 2 additional word lines WX0 and WX1 for controlling storage of data therein. Word line WX0 passes through Level 2 control cells L2 associated with second level switching cells C and D as well as second level cells F, G, H, I, and J and their "complement" cells F*, G*, H*, I*, and J*. Word line WX1 accesses cells A, B, E and E*. The second level control cells L2 do not require additional bit lines but instead share bit lines servicing various Level 1 switching cells within adjacent Level 2 switch cell subarrays.

Note that the word lines WX0 and WX1 and bit lines turn 90 degrees along the main diagonal of crosspoint 300 and that word and bit lines can intersect each other at two locations. The Level 2 rectangular switching cells type L2R are 4×8 cells. In order to switch 8-bit blocks, it is helpful to enable and disable the second level rectangular switching cells and their complements concurrently in pairs. Accordingly each second level rectangular switching cell E–J shares the same bit and word lines with its complement rectangular cell E*–J*. Thus the same bit is stored in the Level 2 control cell L2 for each switching cell E–J as is stored in the control cell for its complement E*–J*. The switching operations of each second level cell and its compliment are therefore always concurrently enabled or disabled.

FIG. 22 is block diagram of the integrated circuit layout of a Level 3 folded, rectangular crosspoint array 310. Array 310 includes a 4×4 array of Level 2, folded rectangular crosspoint arrays 290 of the type illustrated in FIG. 17. For each second level switching cell 290 there is a second level control cell L2 of the type illustrated in FIG. 19B supplying a CONT2 signal to the second level cell 290. There are two rows of such second level control cells L2 and each row receives its own word line 316 or 318. Each second level control cell L2 receives one of the bit lines (not shown) passing through the second level switching cell 290 that it controls. All of the second level control cells L2 receive the same third level control signal CONT3.

FIG. 23 is a symbol L3R depicting the level 3 rectangular crosspoint array of FIG. 22. As discussed herein below, we can use the folded triangular crosspoint array 300 of FIG. 21 and rectangular crosspoint array 310 of FIG. 23 as subarray cells to build a four-level crosspoint array.

FIG. 24 is a block diagram of the integrated circuit layout of the four-level, folded, hierarchical crosspoint array 216 of FIG. 10 capable of switching 320 ports. Array 320 includes a 10×10 array of Level 3 cells, where each Level 3 cell is either a triangular crosspoint array 300 similar to that shown in FIG. 19 or a rectangular crosspoint array 310 similar to that shown in FIG. 13. Crosspoint array 320 also includes a set of Level 3 control cells L3 each providing a control signal CONT3 to a corresponding third level crosspoint array L3R or L3T. Not all 100 level three cells of array 320 are shown but the 10×10 arrangement of third level cells in the four-level array 320 of FIG. 24 follows a pattern similar to the 4×4 arrangement of second level cells in the three-level array 300 of FIG. 19. Array 320 can be used for rapidly switching, for example 8-bit or 32-bit buses connected to its ports by loading data into the Level 1 switching cells defining the desired switching patterns and by using the appropriate level control cells to select the desired switching pattern. Word lines WX0–WX24 provide write control access to the various cells that control level 2 and higher level switch operation.

Hierarchical Control in Rapid Connect Mode

Referring back to FIG. 10, word decoder 228 also controls the WX0–WX24 hierarchical word lines, word lines WX0–WX24 being in the same address space as lines W0–W319. Note that various ones of bit lines B0–B319 access control cells as well as switching cells within array 216. Thus an instruction source 56 of FIG. 4A may use the rapid connect modes of operation not only to access switching cell memories within array 216 but also to control cell memories.

The rapid connect mode of controlling a hierarchical switch array is particularly advantageous when FPID 48 is used for switching between a set of parallel buses, for example between a computer and several peripheral devices. PLD 46 of FIG. 4A uses the normal mode of FPID operation to initially program various subarrays of FPID 48 such that each subarray, when enabled by a bit in its control cell, interconnects a separate pair of the buses. Thereafter an instruction source 56 may switch bus interconnections by appropriately enabling and disabling the various subarrays using the rapid connect mode to alter data stored only in the relatively few control cells that control the arrays. For example to switch a computer bus from one peripheral device to another requires only two cycles of the rapid connect bus 60. A first cycle of the rapid connect bus writes a single bit to a control cell to inhibit the subarray connecting the computer to the first peripheral device. A second cycle of the rapid connect bus writes a single bit to a second control cell which enables a subarray connecting the computer to the second peripheral device.

Hybrid Network Using Programmable Backplane

FIG. 25A depicts a prior art three stage, 16×16 "Clos" network consisting of an array of twelve 4×4 uni-directional, self-routing, data buffering crosspoint switches 400. Such networks are used, for example as hubs in computer networks or to provide communication paths between processors in a parallel processing system. The network can route a data signal arriving at any one of its sixteen input terminals I0–I15 to any one of its sixteen output terminals. Each switch 400 has four input terminals and four output terminals and can route a data signal arriving at any one of its input terminals to any one of its output terminals. Each switch 400 is "self-routing" in that data arriving at an input terminal includes a routing tag directing the switch 400 to route the data to one of its output terminals. One routing tag is required for each stage. Each switch 400 includes internal data buffers which store data packets until the next stage of network is ready to receive them. The interconnections between network stages include paths for the data as well as paths for suitable handshaking signals.

FIG. 25B illustrates a typical 4×4 switch 400 of FIG. 25A. Device 400 includes a 4×4 crossbar switch 412 having four uni-directional inputs I0–I3 and four uni-directional outputs M0–M3. A control circuit 414 strips and decodes a routing from incoming data pack at each input and alters the routing provided by switch 412 accordingly. Last stage switches 400 of FIG. 25A may include FIFO data buffers 413 at each output M0–M3 to store outgoing data packets for subsequent asynchronous transmission via output line N0–N3. Buffers 413 carry out asynchronous handshaking with destination hardware via handshaking lines 415.

The clos network can be scaled up, for example to a 64×64 network, but such a network would require 144 of the 4×4 switches 400 arranged in 9 stages and would be expensive to implement. Also the processing and transmission time overhead for a sending device having to add routing tags for sixteen stages to the data being transmitted over the network would be substantial.

FIG. 26 illustrates a hybrid clos network in accordance with the present invention which may be used, for example, for transmitting data files between computers, or for routing data between processors in a parallel processing system. In the example of FIG. 26 the system serves a set of sixteen computers (or processors) 406. The first two stages of the prior art network of FIG. 25A are replaced with a programmable backplane 401 of the type illustrated in FIG. 4A. Backplane 401 interconnects a set of four PCBs 402–405. Each PCB contains or services a set of four of the computers 406. Each PCB 402–405 includes thereon a separate 4×4 switch 400 of the type employed in the prior art network of FIG. 25A. Each switch 400 receives a separate set of four of the sixteen backplane outputs O0–O15 and switches them to inputs of four computers 406. Each switch 400 is also connected to the four computers 406 by control lines 410 through which they transmit handshaking signals for asynchronously transmitting data therebetween. Each of the four computers 406 of each PCB provides a separate one of the sixteen backplane 401 signal inputs I0–I15. A bus 60 interconnects 24 input/output ports of all computers 406 of each PCB to backplane 401.

Referring to both FIG. 26 and FIG. 4A, when one computer 406 wishes to communicate with another computer 406, it periodically checks data in RAM 58 via bus 60 to determine whether the other computer is currently busy receiving data. When the other computer is available, the first computer 406 stores data in RAM 58 indicating the other computer is busy and then transmits a routing instruction via bus 60 to FPID 48 telling it to establish the desired signal path. Thereafter the sending computer transmits data (along with a single routing tag) via backplane 401 to the switch 400 servicing the receiving computer. The sending computer 406 then sends an instruction to backplane 401 via bus 60 causing it to break the signal path. The receiving switch 400 temporarily stores the data in a data buffer and decodes the routing tag to determine which of the four computers on the PCB is to receive the data. The receiving switch 400 sends the data to the destination computer 406. When the receiving switches buffer has been emptied of data, the destination computer 406 changes the data in RAM 58 to indicate that the receiving switch output port is no longer busy.

The hybrid network of FIG. 26, while providing the data buffering and routing capability of the prior art clos network of FIG. 25, requires sending computers to add only a single routing tag to the data being sent. Also, the hybrid system of FIG. 26 can be easily expanded from 16×16 to larger networks simply by installing additional PCBs in backplane 401 and appropriately reprogramming the backplane. Data transmission speed through the hybrid system of 26 is faster than the prior art clos network since there are fewer stages and few routing tags to decode.

FIG. 27 illustrates a buffered network similar to the hybrid network of FIG. 26 where each switch 400 of FIG. 26 has been replaced by a set of four FIFO data buffers 420 similar to buffers 413 of FIGS. 25B. In this system, where the backplane routes data directly to the receiving computer, the sending computer need not add any routing tag to the data. Where the buffering capability is not needed, buffers 420 may be eliminated and backplane 401 outputs may be directly tied to computers 406.

Programmable Routing Card for Multi-Stage Network

FIG. 28 illustrates the layout of a prior art motherboard 450 providing a backplane for the prior art multi-stage network of FIG. 25A. The motherboard 450 includes a set of four slots 451–454 for receiving prior art printed circuit boards (PCBs) implementing network switching module cards as illustrated in FIG. 29. The backplane includes a set of microstrip conductors 460 on the surface of motherboard 450 for routing signals between contacts 462 on slots 451–454.

FIG. 29 illustrates the layout of a typical switching module card 470. Card 470 includes three routing switches 400. The input and output ports of switches 400 are routed to terminals 472 at the edge card 470 which mate with slot contacts 462 of FIG. 28 when card 470 is installed in one of slots 451–454. Switching module card 470 also includes a set of four input terminals 474 and a set of four output terminals 476 which connect to external signal processors that communicate via the network. When a switching module card 470 of FIG. 29 is installed in each slot 451–454 of motherboard 450 of FIG. 28, the result is the multi-stage network of FIG. 25A having 16 input and 16 output ports. However since switching module cards 470 are expensive and since some applications may require fewer than the full complement of 16 inputs and 16 output ports, it is preferable to install in motherboard 450 only the number of switching module cards 470 that are necessary to provide the needed number of input and output ports.

FIG. 30 shows a network 480 that results when only a single card 470 of FIG. 29 is installed in slot 451 of FIG. 28. Network 480 can interconnect any of four inputs to any of four outputs. However network 480 is less than satisfactory in many applications. Due to the lack of full connectivity between stages, only one input to output signal path can be established at any given moment. However, by installing a prior art routing module card 482, as illustrated in FIG. 31, in each of the remaining three slots 452–454, the network 484 of FIG. 32 results. Network 484 provides up to four independent signal paths between the network input and output ports.

FIG. 33 shows an 8×8 network 485 that results when a switching module card 470 of FIG. 29 is installed in each of slots 451 and 452 of the motherboard 450 of FIG. 28 and a routing card 482 of FIG. 31 is installed in each of slots 453 and 454. Network 486 provides eight independent paths between inputs 486 and 487 but provides only four interconnections between the two switching modules. This limits the capability of the network to provide interconnections between signal processors connected to different switching modules. We can optimize the 8×8 network by installing routing cards 490 and 492 of FIGS. 34 and 35, respectively, in slots 453 and 454 instead of routing cards 482 of FIG. 31. The resulting 8×8 network 494 of FIG. 36 provides a full complement of eight paths between switching module cards.

Thus as may be seen, a different set of routing cards are needed to optimize the network for each number of switching module cards that are installed in the motherboard. For a 16×16 network as illustrated in FIG. 25A, only a few different routing card configurations are need. However multi-stage networks are often much larger than the 16×16 network of FIG. 25A. A 256×256 network requires a great number of routing card types to optimize the network for each number of 1–256 switching module cards that may be employed in the network. It is difficult for a network system manufacture to make or stock all the different types of routing cards needed and it is difficult for a network system installer to be sure that the right routing card are installed in each slot when setting up or expanding a network.

FIG. 37 illustrates an improved routing card 496 in accordance with the present invention. Routing card 496 includes a pair of FPIDs 497, a programmable logic device (PLD) 498, and a ROM 499. On system startup, PLD 498 reads programming data out of ROM 499 and loads it into FPIDs 497. FPIDs 497 provide signal routing between the routing card terminals 500 and can be programmed by the data from ROM 499 to emulate the routing provided by any of the cards of FIGS. 31, 34 and 35 or any other desired routing. PLD 498 and ROM 499 are similar to PLD 28 and ROM 30 of FIG. 3B. To change the routing provided by card 496, one need only change the data stored in ROM 499, which may also be an EPROM or an EEPROM write accessed by a host computer via a serial port 501. Thus a manufacturer need provide only a single type of routing card along with software for downloading appropriate data into ROM 499 when port 501 is connected to a computer.

Programmable Backplane for Multi-Stage Network

FIG. 38 illustrates an improved version of the prior art backplane of FIG. 28. A pair of FPIDs 510 flexibly interconnect terminals of slots 512–515 for receiving the prior art switching module cards 470 of FIG. 29. FPIDs 510 are similar to FPID 16 of FIG. 2. On system startup, PLD 517 forwards programming data stored in ROM 516 which may be a PROM, EPROM or EEPROM. PLD 516 and ROM 516 are similar to PLD 28 and ROM 30 of FIG. 3B. The backplane routing provided by FPIDs 510 can be altered by changing ROM 516, or by changing the data stored in ROM 516. The FPIDs 510 can be programmed so that the improved backplane of FIG. 38 provides the optimal signal routing patterns such as seen in FIG. 25A, 32 for a given number of switching module cards installed in slots 512–515. Moreover, the programmable backplane of FIG. 38 can provide an optimal routing pattern without requiring installation of routing cards in any unused slots 512–515.

Thus has been shown preferred and alternative embodiments of a programmable backplane as best seen in FIGS. 2, 4A, and 38. The backplanes provide actively buffered, bi-directional signal paths between PCBs installed on a motherboard and allow these signal paths to be easily rerouted by changing the contents of a ROM on the motherboard. The embodiment of FIG. 4A also permits devices mounted on or having access to the PCBs being interconnected by the backplane to quickly alter its signal routing, thereby to optimize the backplane configuration to suit changing communication needs of the PCBs. The use of a programmable backplane as a network hub is illustrated in FIGS. 26 and 27 and the use of an FPID in a programmable routing card as shown in FIG. 37 has also been described.

While the forgoing specification has described preferred embodiment(s) of the present invention, one skilled in the art may make many modifications to the preferred embodiment without departing form the invention in its broader aspects. The appended claims therefore are intended to cover all such modifications as fall within the true scope and spirit of the invention.

We claim:

1. A programmable backplane for buffering and routing bi-directional signals between terminals of printed circuit boards (PCBs) in accordance with a signal routing pattern indicated by a set of input data bits, the backplane comprising:

a motherboard having means for mounting said PCBs;

a plurality of ports mounted on said motherboard, each of said ports corresponding to a separate one of the PCB terminals;

buffer means mounted on said motherboard for providing a separate bi-directional signal path between each of said ports and its corresponding PCB terminal, wherein said buffer means senses directions of signals flowing through said signal path and amplifies said signals in the sensed directions; and routing means mounted on said motherboard for receiving and storing said data bits and for routing said bi-directional signals between selected pairs of said ports in accordance with said routing pattern indicated by the stored data bits.

2. The programmable backplane in accordance with claim 1 wherein said routing means comprises a folded crosspoint array comprising:

a plurality of switch cells, each switch cell occupying a separate rectangle in a common plane of an integrated circuit, said rectangle having parallel first edges and adjacent second edges, said first edges being substantially longer than said second edges, each switch cell comprising a first conductor extending between said second edges of said rectangle, a second conductor extending between said second edges of said rectangle, a first memory cell for storing a separate one of said data bits, and means coupled to said first and second conductors and said first memory cell for selectively providing a signal path between said first and second conductors in response to a state of said separate one of said data bits, for conveying one of said bi-directional signals.

3. The programmable backplane in accordance with claim 2 wherein said switch cells abut one another to form substantially a square in said common plane.

4. The programmable backplane in accordance with claim 3 wherein said first edges are substantially twice as long as said second edges.

5. The programmable backplane in accordance with claim 1 wherein at least one of said PCBs generates and transmits an output data word and wherein said routing means comprises:

switch means for storing said input data bits, each data bit having a state indicating whether said switch means is to convey a signal between an associated pair of said ports, and for conveying bi-directional signals between each pair of said ports when indicated by the state of the associated data bit; and control means for receiving said input data bits and storing them in said switch means, for receiving said data word from said at least one PCB, said data word identifying a particular bit of said set of data bits stored in said switch means and indicating a state to which said particular bit is to be set, and for setting said particular bit stored in said switch means to the indicated state.

6. The programmable backplane in accordance with claim 5 wherein said switch means further comprises:

a plurality of memory cells;

a plurality of word lines, each word line being connected to a separate first subset of said memory cells for conveying a write signal thereto; and a plurality of bit lines, each bit line being connected to a separate second subset of said memory cells for conveying a bit thereto, wherein each memory cell is connected to a separate and unique combination of word and bit lines, and wherein each memory cell stores the bit conveyed by the bit line to which it is connected upon receipt of the write signal conveyed on the word line to which it is connected.

7. The programmable backplane in accordance with claim 6 wherein said control means sets said particular bit stored in said switch means to the indicated state by placing a bit of said indicated state on only a particular one of said bit lines and by transmitting a write signal on only a particular one of said word lines, and wherein said data word identifies said particular bit by identifying said particular one of said bit lines and said particular one of said word lines.

8. The programmable backplane in accordance with claim 1 wherein said buffer means comprises at least one bi-directional buffer connected between one of said ports and one of said PCB terminals for bi-directionally buffering one of said bi-directional signals therebetween, said bi-directional buffer comprising:

first unidirectional buffer means connected between the one port and the one terminal and having an input for receiving a first busy signal, for detecting whether said first busy signal is asserted or de-asserted and for detecting appearance of said bi-directional signal at said one terminal, wherein upon detecting appearance of said one bi-directional signal at said one terminal while concurrently detecting said first busy signal is de-asserted, said first uni-directional buffer means buffers said one bi-directional signal appearing at said one terminal onto said one port and concurrently asserts a second busy signal; and second unidirectional buffer means connected between the one port and one terminal and having an input for receiving said second busy signal, for detecting whether said second busy signal is asserted or de-asserted and for detecting appearance of said bi-directional signal at said one port, wherein upon detecting appearance of said one bi-directional signal at said one port while concurrently detecting said second busy signal is de-asserted, said second uni-directional buffer means buffers said one bi-directional signal appearing at said one port onto said one terminal and concurrently asserts said first busy signal.

9. The programmable backplane in accordance with claim 5 wherein said buffer means comprises at least one bi-directional buffer connected between one of said ports and one of said PCB terminals for bi-directionally buffering one of said bi-directional signals therebetween, said bi-directional buffer comprising:

first unidirectional buffer means connected between the one port and the one terminal and having an input for receiving a first busy signal, for detecting whether said first busy signal is asserted or de-asserted and for detecting appearance of said bi-directional signal at said one terminal, wherein upon detecting appearance of said one bi-directional signal at said one terminal while concurrently detecting said first busy signal is de-asserted, said first uni-directional buffer means buffers said one bi-directional signal appearing at said one terminal onto said one port and concurrently asserts a second busy signal; and second unidirectional buffer means connected between the one port and one terminal and having an input for receiving said second busy signal, for detecting whether said second busy signal is asserted or de-asserted and for detecting appearance of said bi-directional signal at said one port, wherein upon detecting appearance of said one bi-directional signal at said one port while concurrently detecting said second busy signal is de-asserted, said second uni-directional buffer means buffers said one bi-directional signal appearing at said one port onto said one terminal and concurrently asserts said first busy signal.

10. A programmable backplane for routing signals between printed circuit boards (PCBs) in response to an input routing instruction, the programmable backplane comprising:

a motherboard for holding said PCBs;

routing means mounted on said motherboard, coupled to receive said routing instruction, and coupled to said PCBs mounted on said motherboard for routing said signals therebetween, for storing a set of data bits defining a routing pattern for routing signals between said PCBs, for receiving said routing instruction, said routing instruction indicating an alteration to said routing pattern by indicating a change to be made to a bit of the stored set of data bits, said routing instruction including an identification of the single bit to be altered, and for altering said bit in accordance with said instruction, wherein said routing means routes said signals between said PCBs in accordance with the altered routing pattern as defined by said data bits.

11. The programmable backplane in accordance with claim 10 wherein at least one of said PCBs held by said motherboard transmits said routing instruction, the backplane further comprising a bus formed on said motherboard and coupled to said at least one PCB for receiving said routing instruction transmitted by said at least one PCB and conveying said routing instruction to said routing means.

12. The programmable backplane in accordance with claim 11 further comprising memory means connected to said bus for storing data transmitted thereto from said at least one PCB, the data indicating a currently selected routing pattern.

13. The programmable backplane in accordance with claim 10 further comprising means mounted on said motherboard for generating and transmitting said set of data bits to said routing means for storage therein.

14. The programmable backplane in accordance with claim 10 wherein said signals are bi-directional signals and wherein said routing means bi-directionally buffers said signals as it routes them between said PCBs.

15. A programmable backplane for routing signals between printed circuit boards (PCBs) in response to an input routing instruction, the programmable backplane comprising:

a motherboard for holding said PCBs;

routing means mounted on said motherboard and coupled to said PCBs mounted on said motherboard for routing said signals therebetween, for storing a set of data bits defining a plurality of different routing patterns for routing signals between said PCBs, for receiving said input routing instruction, said routing instruction selecting a particular one of said plurality of routing patterns defined by the stored data, wherein said routing means routes said signals between said PCBs in accordance with the particular routing pattern defined by said data bits and selected by said routing instruction.

16. The programmable backplane in accordance with claim 15 wherein at least one of said PCBs held by said motherboard transmits said routing instruction, and wherein the backplane further comprises a bus formed on said motherboard and coupled to said at least one of said PCBs for receiving said routing instruction transmitted by said at least one PCB and conveying said instruction to said routing means.

17. The programmable backplane in accordance with claim 16 further comprising memory means connected to said bus for storing data transmitted thereto from said at least one PCB, the data indicating the selected particular routing pattern.

18. The programmable backplane in accordance with claim 15 further comprising means mounted on said motherboard for generating and transmitting said set of data bits to said routing means for storage therein.

19. The programmable backplane in accordance with claim 15 wherein one of said signals are bi-directional signals and wherein said routing means bi-directionally buffers said bi-directional signals as it routes them between said PCBs.

20. The programmable backplane in accordance with claim 19 wherein said routing means includes means for bi-directionally buffering said bi-directional signals, including at least one bi-directional buffer for buffering one of said bi-directional signals, said at least one bi-directional buffer comprising:

a first port;

a second port;

first unidirectional buffer means connected between said first and second ports and having an input for receiving a first busy signal, for detecting whether said first busy signal is asserted or de-asserted and for detecting appearance of said bi-directional signal at said first port, wherein upon detecting appearance of said one bi-directional signal at said first port while concurrently detecting said first busy signal is de-asserted, said first uni-directional buffer means buffers said one bi-directional signal appearing at said first port onto said second port and concurrently asserts a second busy signal; and second unidirectional buffer means connected between said first and second ports and having an input for receiving said second busy signal, for detecting whether said second busy signal is asserted or de-asserted and for detecting appearance of said bi-directional signal at said second port, wherein upon detecting appearance of said one bi-directional signal at said second port while concurrently detecting said second busy signal is de-asserted, said second uni-directional buffer means buffers said one bi-directional signal appearing at said second port onto said second port and concurrently asserts said first busy signal.

21. The programmable backplane in accordance with claim 15 wherein said routing means comprises a folded crosspoint array comprising:

a plurality of switch cells, each switch cell occupying a separate rectangle in a common plane of an integrated circuit, said rectangle having parallel first edges and adjacent second edges, said first edges being substantially longer than said second edges, each switch cell comprising a first conductor extending between said second edges of said rectangle, a second conductor extending between said second edges of said rectangle, a first memory cell for storing a separate one of said data bits, and means coupled to said first and second conductors and said first memory cell for selectively providing a signal path between said first and second conductors in response to a state of said separate one of said data bits for conveying one of said signals.

22. The programmable backplane in accordance with claim 21 wherein said switch cells abut one another to form substantially a square in said common plane.

23. The programmable backplane in accordance with claim 22 wherein said first edges are substantially twice as long as said second edges.

24. A programmable routing card for a multi-stage network, the network comprising a backplane having a plurality of slots for receiving switching modules mounted on printed circuit boards, the switching modules selectively routing signals between signal processors connected thereto, the backplane having conductors for conveying ones of said signals between said switching modules, the programmable routing card comprising:

a printed circuit board (PCB) adapted for insertion in said slots;

a plurality of terminals mounted on said PCB, each of said terminals being coupled to a separate one of said backplane conductors when said PCB is inserted in one of said slots;

a plurality of ports mounted on said PCB, each port corresponding to a separate one of said terminals;

buffer means mounted on said PCB for providing a separate bi-directional signal path between each of said terminals and its corresponding port, wherein said buffer means senses directions of signals flowing through said signal path and amplifies said signals in the sensed directions; and routing means, mounted on said PCB and storing data bits representing a signal routing pattern, for routing signals between pairs of said ports selected in accordance with said routing pattern represented by the stored data bits.

25. The programmable routing card in accordance with claim 24 further comprising means mounted on said PCB for transmitting said data bits to said routing means for storage therein.

26. The programmable routing card in accordance with claim 24 further comprising:

memory means mounted on said PCB for storing said data bits; and control means mounted on said PCB for reading said data bits out of said memory means and transmitting said data bits to said routing means for storage therein.

27. An improved backplane for a multi-stage network of the type having a plurality of switching modules mounted on printed circuit boards, the switching modules selectively routing signals between signal processors connected thereto, the printed circuit boards being held by a motherboard having a backplane for routing signals between the switching modules, the improved backplane comprising:

a plurality of ports mounted on said motherboard and contacting said switching modules for transmitting and receiving said signals to and from said switching modules;

buffer means mounted on said motherboard for providing a separate buffered signal path between each of said ports; and routing means, mounted on said motherboard and storing data bits representing a signal routing pattern, for routing said signals conveyed on the backplane conductors contacting said ports between pairs of said ports selected in accordance with said routing pattern indicated by the stored data bits.

28. The improved backplane in accordance with claim 27 further comprising means mounted on said motherboard for transmitting said data bits to said routing means for storage therein.

29. The improved backplane in accordance with claim 27 further comprising:

memory means mounted on said motherboard PCB for storing said data bits; and control means mounted on said mother board for reading said data bits out of said memory means and transmitting said data bits to said routing means for storage therein.

30. A programmable backplane for routing signals between terminals of printed circuit boards (PCBs) in response to a signal routing pattern indicated by a set of input data bits and in response to input control data, the backplane comprising:

a motherboard having means for mounting said PCBs;

a plurality of ports mounted on said motherboard, each of said ports corresponding to a separate one of the PCB terminals;

buffer means mounted on said mother board for receiving said control data and for selectively providing either a buffered signal path or non-buffered signal path between each of said ports and its corresponding PCB terminal, said buffer means selecting between the buffered signal path and non buffered signal path in response to said control data; and routing means mounted on said motherboard for receiving and storing said data bits and for routing said signals between selected pairs of said ports in accordance with said routing pattern indicated by the stored data bits.

31. An apparatus for routing signals between terminals in response to a signal routing pattern indicated by a set of input data bits and in response to input control data, the apparatus comprising:

a plurality of terminals;

a plurality of ports, each port corresponding to a separate one of said terminals;

buffer means mounted for receiving said control data and for selectively providing either a buffered signal path or non-buffered signal path between each of said ports and its corresponding terminal, said buffer means selecting between the buffered signal path and non-buffered signal path in response to said control data; and routing means for receiving and storing said data bits and for routing said signals between selected pairs of said ports in accordance with said routing pattern indicated by the stored data bits.

32. The apparatus in accordance with claim 31 wherein said buffer means comprises at least one bi-directional buffer connected between one of said ports and one of said terminals for bi-directionally buffering one of said signals therebetween, said bi-directional buffer comprising:

first unidirectional buffer means connected between the one port and the one terminal and having an input for receiving a first busy signal, for detecting whether said first busy signal is asserted or de-asserted and for detecting appearance of said bi-directional signal at said one terminal, wherein upon detecting appearance of said one bi-directional signal at said one terminal while concurrently detecting said first busy signal is de-asserted, said first uni-directional buffer means buffers said one bi-directional signal appearing at said one terminal onto said one port and concurrently asserts a second busy signal; second unidirectional buffer means connected between the one port and one terminal and having an input for receiving said second busy signal, for detecting whether said second busy signal is asserted or de-asserted and for detecting appearance of said bi-directional signal at said one port, wherein upon detecting appearance of said one bi-directional signal at said one port while concurrently detecting said second busy signal is de-asserted, said second uni-directional buffer means buffers said one bi-directional signal appearing at said one port onto said one terminal and concurrently asserts said first busy signal;

and switch means connected between said one port and said one terminal for selectively providing said non-buffered signal path therebetween in response to said input control data.

* * * * *